(12) United States Patent
Matsuda

(10) Patent No.: US 9,634,465 B2
(45) Date of Patent: Apr. 25, 2017

(54) OPTICAL DEVICE AND OPTICAL MODULE

(71) Applicant: FUJITSU LIMITED, Kawasaki-shi, Kanagawa (JP)

(72) Inventor: Manabu Matsuda, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/203,825

(22) Filed: Mar. 11, 2014

(65) Prior Publication Data

US 2014/0294031 A1 Oct. 2, 2014

(30) Foreign Application Priority Data

Mar. 29, 2013 (JP) ................................. 2013-075032

(51) Int. Cl.
| | |
|---|---|
| H01S 5/12 | (2006.01) |
| H01S 5/062 | (2006.01) |
| H01S 5/0625 | (2006.01) |
| H01S 5/10 | (2006.01) |
| H01S 5/22 | (2006.01) |
| H01S 5/223 | (2006.01) |

(52) U.S. Cl.
CPC ............ *H01S 5/124* (2013.01); *H01S 5/1225* (2013.01); *H01S 5/0622* (2013.01); *H01S 5/06258* (2013.01); *H01S 5/1014* (2013.01); *H01S 5/1017* (2013.01); *H01S 5/22* (2013.01); *H01S 5/2218* (2013.01); *H01S 5/2231* (2013.01)

(58) Field of Classification Search
CPC ................. H01S 5/1225; H01S 5/227; H01S 5/223–5/2277; H01S 5/12–5/1246
See application file for complete search history.

(56) References Cited

U.S. PATENT DOCUMENTS

| | | | | |
|---|---|---|---|---|
| 4,270,096 | A | * | 5/1981 | Hayashi et al. ............ 372/46.01 |
| 5,027,364 | A | * | 6/1991 | Thulke ....................... 372/46.01 |
| 5,170,402 | A | | 12/1992 | Ogita et al. |
| 5,247,536 | A | * | 9/1993 | Kinoshita ....................... 372/96 |
| 5,394,429 | A | * | 2/1995 | Yamada et al. ................. 372/96 |

(Continued)

FOREIGN PATENT DOCUMENTS

| | | |
|---|---|---|
| CN | 1870368 A | 11/2006 |
| JP | 8-255954 | 10/1996 |

(Continued)

OTHER PUBLICATIONS

Lee et al., "Proposal of DFB Lasers with Refractive Index Modulated Upper Cladding Layer of the Grating for Reducing Spatial Hole Burning Effect," 1999, OSA/IPR, RTuG5, 228-230.*

(Continued)

*Primary Examiner* — Joshua King
(74) *Attorney, Agent, or Firm* — Staas & Halsey LLP

(57) ABSTRACT

An optical device includes an active layer disposed over a semiconductor substrate, a diffraction grating disposed over the active layer, a clad layer partly disposed over the diffraction grating, at least one first burying material layer disposed beside side surfaces of end portions of the clad layer over the diffraction grating, and at least one second burying material layer disposed beside side surfaces of a center portion of the clad layer over the diffraction grating. A refractive index of the at least one first burying material layer is different from a refractive index of the at least are second burying material layer.

12 Claims, 30 Drawing Sheets

(56) References Cited

U.S. PATENT DOCUMENTS

| | | |
|---|---|---|
| 5,659,562 A | 8/1997 | Hisa |
| 6,009,112 A * | 12/1999 | Uchida ................ H01S 5/2231 372/46.01 |
| 6,252,895 B1 | 6/2001 | Nitta et al. |
| 2002/0085270 A1* | 7/2002 | Bendett ........................ 359/343 |
| 2006/0091501 A1* | 5/2006 | Hanaoka et al. ............. 257/615 |
| 2007/0133648 A1* | 6/2007 | Matsuda et al. .............. 372/102 |
| 2007/0183470 A1* | 8/2007 | Nakabayashi ............. 372/46.01 |
| 2007/0223549 A1* | 9/2007 | Livshits et al. ............ 372/45.01 |
| 2009/0086206 A1* | 4/2009 | Mori ............................ 356/326 |
| 2009/0185594 A1* | 7/2009 | Hiroyama et al. ......... 372/45.01 |
| 2010/0265980 A1* | 10/2010 | Matsuda .................... 372/46.01 |
| 2010/0322557 A1 | 12/2010 | Matsuda et al. |
| 2011/0164642 A1* | 7/2011 | Onishi ................ H01S 5/02461 372/46.012 |
| 2013/0287054 A1* | 10/2013 | Kwon et al. ............... 372/45.01 |

FOREIGN PATENT DOCUMENTS

| | | |
|---|---|---|
| JP | 11-243256 | 9/1999 |
| JP | 2966485 | 10/1999 |
| JP | 2009-206126 | 9/2009 |
| WO | 2009/116152 A1 | 9/2009 |

OTHER PUBLICATIONS

S. Ogita et al., "FM Response of Narrow-Linewidth, Multielectrode λ/4 Shift DFB Laser," *IEEE Photonics Technology Letters,* vol. 2, No. 3, Mar. 1990, pp. 165-166.

G. Morthier et al., "A New DFB-Laser Diode with Reduced Spatial Hole Burning," *IEEE Photonics Technology Letters,* vol. 2, No. 6, Jun. 1990, pp. 388-390.

M. Matsuda et al., "Reactively Ion Etched Nonuniform-Depth Grating for Advanced DFB Lasers," *3rd International Conference on Indium Phosphide and Related Materials,* TuF.4, Apr. 1991, pp. 256-259.

Chinese Office Action mailed Jun. 27, 2016 in related Chinese Application No. 201410123644.X.

\* cited by examiner

PHASE SHIFT OF RADIAN
( λ/4 SHIFT)

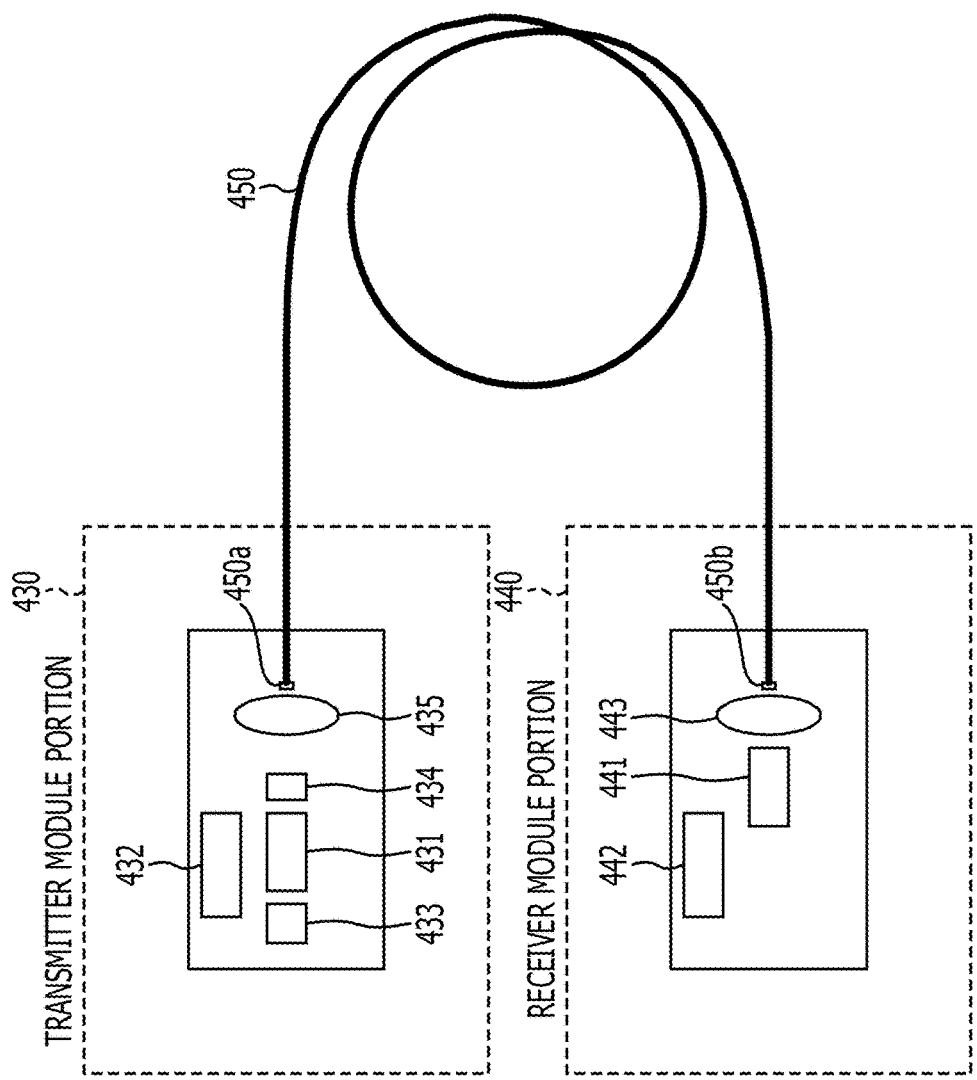

OPTICAL DEVICE AND OPTICAL MODULE

CROSS-REFERENCE TO RELATED APPLICATION

This application is based upon and claims the benefit of priority of the prior Japanese Patent Application No. 2013-075032, filed on Mar. 29, 2013, the entire contents of which are incorporated herein by reference.

FIELD

The embodiments discussed herein are related to an optical device and an optical module.

BACKGROUND

Examples of ridge waveguide optical devices incorporated with diffraction gratings include a distributed-feedback laser (DFB) formed from a compound semiconductor. In recent years, improvements in laser characteristics of the DFB laser have been proposed, where a structure in which a coupling coefficient to determine the amount of feedback of a diffraction grating is allowed to distribute in a resonator direction is adopted. For example, suppression of hole burning in the axis direction and an improvement in a longitudinal mode stability in a high optical output have been proposed, where a structure in which a coupling coefficient is allowed to distribute in such a way as to become small toward the resonator center is adopted.

In order to suppress an occurrence of hole burning, it has been proposed that the width of a buried diffraction grating is gradually decreased toward the resonator center or the width of the buried diffraction grating is gradually increased toward the resonator center. Furthermore, it has also been proposed that the height of a buried diffraction grating is gradually increased toward the resonator center or the height of the buried diffraction grating is gradually decreased toward the resonator center.

It has also been proposed that a large threshold gain difference or gain difference between the main mode and the side mode is obtained by adopting a structure in which the coupling coefficient is increased at the resonator center and the coupling coefficients at both ends are decreased as compared with the coupling coefficient at the center.

In the case where a drive electrode is divided into three parts in a resonator direction and a DFB laser to modulate the injection current of the center electrode is used as an FM modulation light source, it has been proposed that the width of the spectral line is decreased by increasing the length of the resonator.

In actual production of such a device, in the case where the structure in which a coupling coefficient is allowed to distribute in a resonator direction is adopted, it is desirable that a difference in coupling coefficient be increased between a region where the coupling coefficient is increased and a region where the coupling coefficient is decreased in order to improve the device characteristics. That is, it is desirable that the contrast in the coupling coefficient be enhanced.

However, in the case where a diffraction grating is formed by forming unevenness on the surface of an InP substrate and burying the unevenness in a semiconductor layer, in order to increase the difference in coupling coefficient between the region where the coupling coefficient is increased and the region where the coupling coefficient is decreased, it is desirable that the depth of the diffraction grating is specified to be very small in the region where the coupling coefficient is decreased.

It is difficult to precisely stably produce such a very shallow diffraction grating. Therefore, variations occur in the coupling coefficient, device characteristics (here, the threshold of lasing) are fluctuated, and the yield is not good.

For example, in the case where the depth of the buried diffraction grating is changed, the width of the diffraction grating in the region where the coupling coefficient is maximized is formed in such a way as to become half the period of the diffraction grating (duty ratio is 50%). In the region where the coupling coefficient is small, the width of the diffraction grating is made larger than that (duty ratio is larger than 50%) or smaller than that (duty ratio is smaller than 50%). However, in order to increase the difference in coupling coefficient between the region where the coupling coefficient is increased and the region where the coupling coefficient is decreased, it is desirable that the width of the diffraction grating is made very large or very small in the region where the coupling coefficient is decreased.

In the case where the width of the diffraction grating is made very large, an opening portion of a mask to form the diffraction grating becomes very narrow and, thereby, formation of the diffraction grating by etching is difficult. On the other hand, in the case where the width of the diffraction grating is made very small, the width of the etching mask is also made very small, although precise, stable production of a mask having, for example, a several-percent width is difficult. Even when a diffraction grating having a very small width is formed, the diffraction grating may disappear when being buried. Therefore, stable formation of a buried diffraction grating is difficult and the yield is not good.

Accordingly, the present inventors propose an optical device having a structure in which a coupling coefficient of a diffraction grating is allowed to distribute in a resonator and being capable of increasing a difference in coupling coefficient between a region where the coupling coefficient is increased and a region where the coupling coefficient is decreased at a high yield.

The following are reference documents:
[Document 1] Japanese Laid-open Patent Publication No. 8-255954,
[Document 2] Japanese Patent No. 2966485,
[Document 3] International Publication Pamphlet No. WO 2009/116152,
[Document 4] G. Morthier and others, "A New DFB-Laser Diode with Reduced Spatial Hole Burning", *IEEE Photonics Technology Letter*, vol. 2, No. 6, pp. 388-390, June 1990,
[Document 5] M. Matsuda and others, "Reactively Ion Etched Nonuniform-Depth Grating for Advanced DFB Lasers", 3*rd International Conference on Indium Phosphide and Related Materials*, TuF. 4, Apr. 8-11, 1991, and
[Document 6] S. Ogita and others, "FM Response of Narrow-Linewidth, Multielectrode λ/4 Shift DFB Laser", *IEEE Photonics Technology Letters*, vol. 2, No. 3, pp. 165-166, March 1990.

SUMMARY

According to an aspect of the invention, an optical device includes an active layer disposed over a semiconductor substrate, a diffraction grating disposed over the active layer, a clad layer partly disposed over the diffraction grating, at least one first burying material layer disposed beside side surfaces of end portions of the clad layer over the diffraction grating, and at least one second burying material layer disposed beside side surfaces of a center portion of the clad layer over the diffraction grating. A refractive index of the at least one first burying material layer is different from a refractive index of the at least are second burying material layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 20 is a structural diagram of an optical module according to a fifth embodiment;

DESCRIPTION OF EMBODIMENTS

Figure 1:
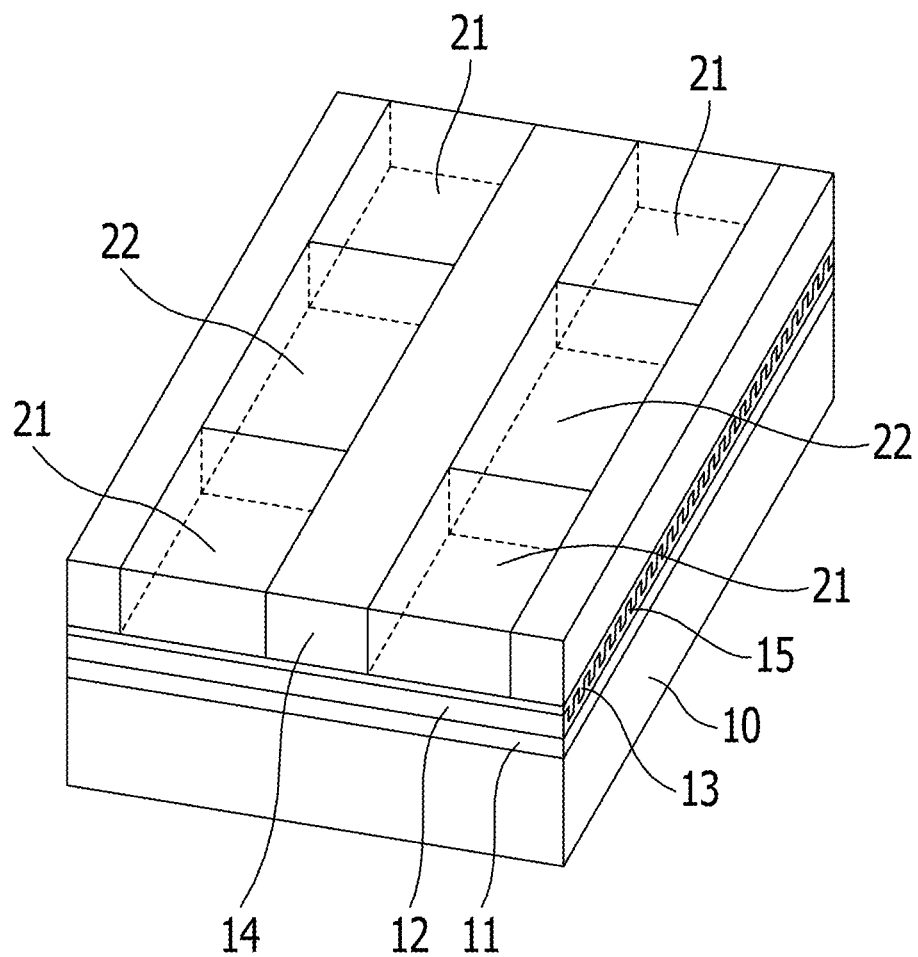
FIG. 1 is a perspective view of a key portion of an optical device according to a first embodiment.

The embodiments will be described below. In this regard, the same members and the like are indicated by the same reference numerals and further explanations thereof will not be provided.

First Embodiment

[Optical Device]

Figure 2A:
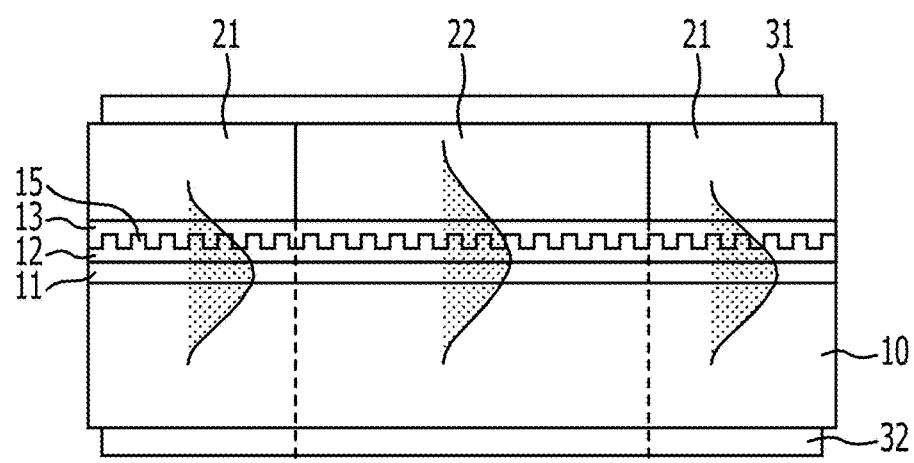
FIGS. 2A and 2B are explanatory diagrams of the optical device according to the first embodiment.

A first embodiment will be described. An optical device in the present embodiment is a ridge waveguide optical device and is provided with an active layer 11, a diffraction grating layer 12, a semiconductor burying layer 13, and a clad layer 14 on a semiconductor substrate 10, as illustrated in FIG. 1 and FIG. 2A. A diffraction grating 15 is formed by forming unevenness on the surface of the diffraction grating layer 12 and burying the unevenness formed on the surface with the semiconductor burying layer 13. First burying material layers 21 and second burying material layers 22 are disposed beside both side surfaces of the clad layer 14 disposed having a large thickness. The first burying material layers 21 are disposed beside both side surfaces of both end portions, which have a predetermined length from the end, of the clad layer 14 disposed having a large thickness and the second burying material layers 22 are disposed beside both side surfaces of the center portion of the clad layer 14. In the present embodiment, the refractive index n1 of the first burying material layer 21 is specified to become smaller than the refractive index n2 of the second burying material layer 22, that is, n2>n1 is satisfied. An upper electrode 31 is disposed on the clad layer 14 disposed having a large thickness, and a lower electrode 32 is disposed on the back of the semiconductor substrate 10. In the present embodiment, the semiconductor substrate 10 functions as a lower clad layer, and the active layer 11 in the region provided with the clad layer 14 serves as an optical waveguide.

Figure 2B:
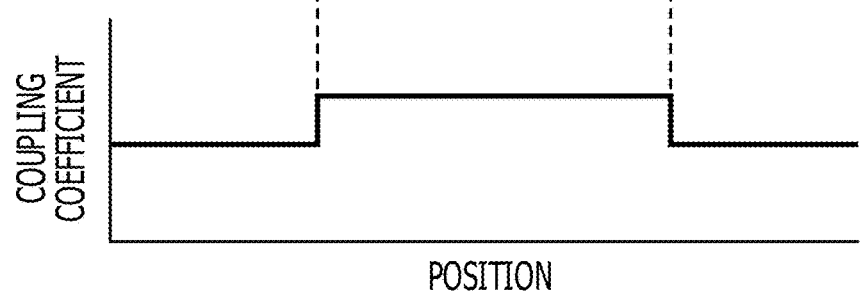

Consequently, the distribution of light propagating through the optical waveguide is attracted to the side of the clad layer 14 disposed having a large thickness in the center portion rather than the end portions at both ends of the optical waveguide, so that, as illustrated in FIG. 2B, the coupling coefficient becomes high in the center portion of the optical waveguide and becomes low in the end portions at both ends. Therefore, in the case where the optical device according to the present embodiment is used as an FM modulation light source, the efficiency and the like of the FM modulation may be improved.

In the present embodiment, an n-InP substrate is used for the semiconductor substrate 10. The active layer 11 is an MQW active layer made from GaInAsP or the like. Well layers having a thickness of 6 nm and barrier layers having a thickness of 10 nm are disposed alternately and a four-layered well layer is disposed in such a way that the emission wavelength becomes 1.55 μm. The thickness of the diffraction grating layer 12 and the semiconductor burying layer 13 constituting the diffraction grating 15 is 30 nm and the diffraction grating layer 12 is disposed in such a way that the composition wavelength becomes 1.18 μm. The clad layer 14 is made from n-InP having a width of 1.5 μm. The first burying material layer 21 is made from MgF2 having a refractive index n1 of about 1.37, and the second burying material layer 22 is made from TiO2 having a refractive index n2 of about 2.52.

Figure 3:
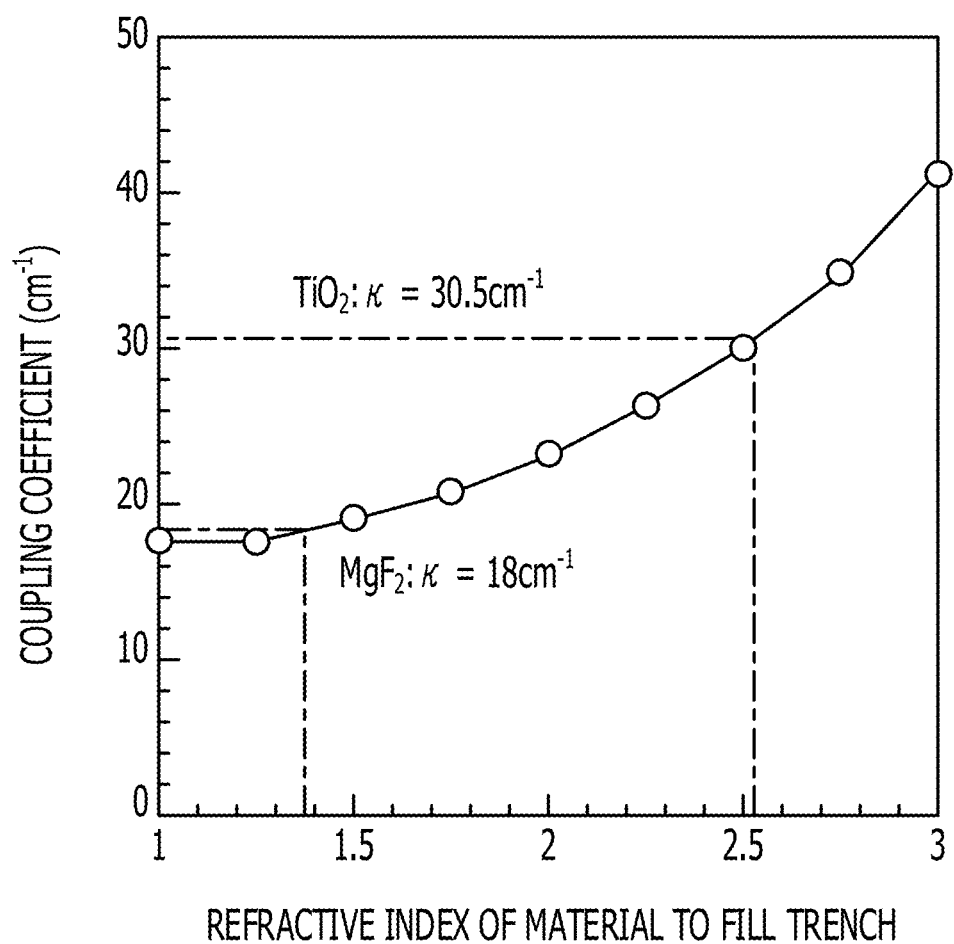
FIG. 3 is a correlation diagram of the refractive index and the coupling coefficient in a trench.

As illustrated in FIG. 3, in the case where MgF2 having a refractive index n1 of about 1.37 is used, the coupling coefficient κ is 18 cm−1, and in the case where TiO2 having a refractive index n2 of about 2.52 is used, the coupling coefficient κ is 30.5 cm−1, so that the coupling coefficient is different by a factor of 1.7. Consequently, the coupling coefficient in the center portion of the optical waveguide may be increased correspondingly.

Second Embodiment

[Optical Device]

Figure 4:
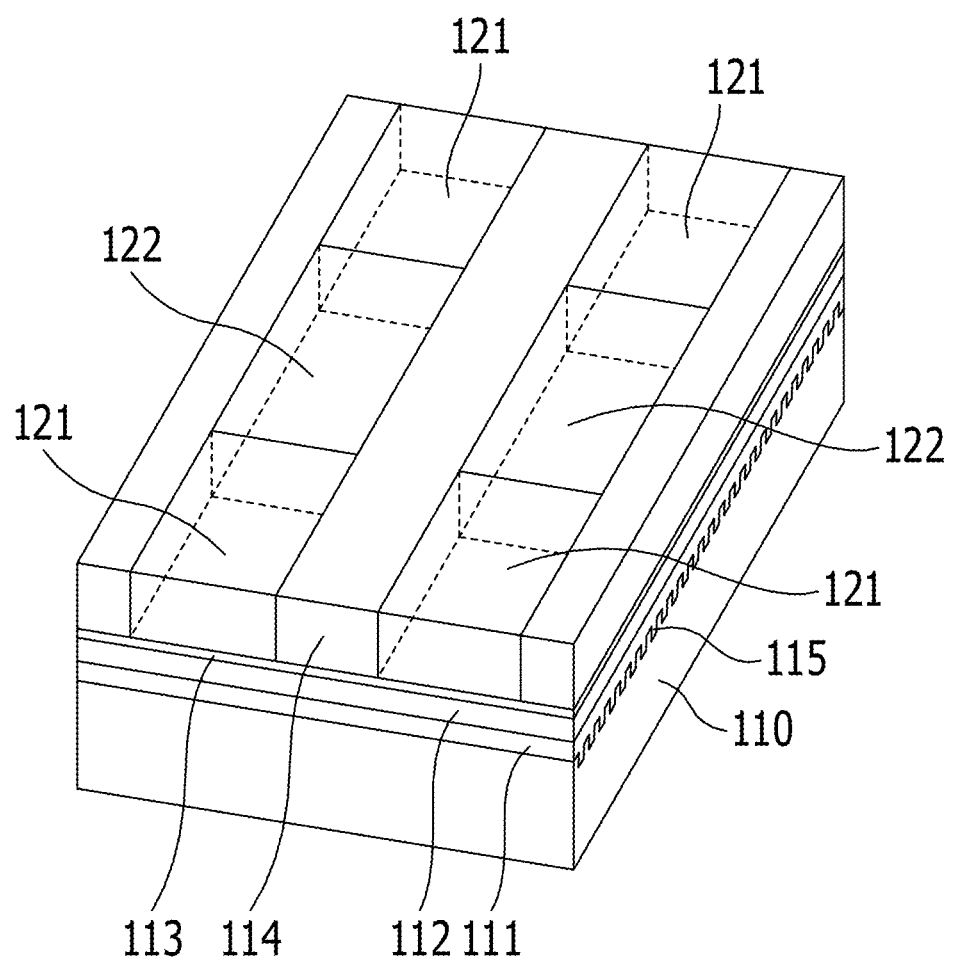
FIG. 4 is a perspective view of a key portion of an optical device according to a second embodiment.
Figure 5A:
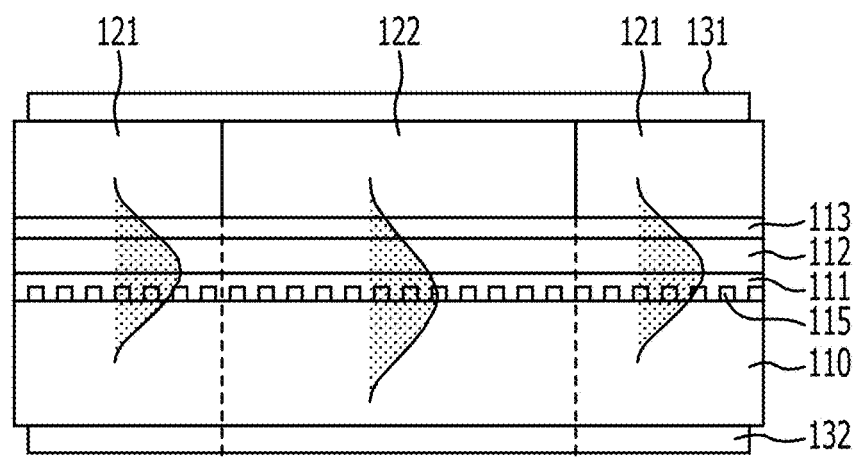
FIGS. 5A and 5B are explanatory diagrams of the optical device according to the second embodiment.

A second embodiment will be described. An optical device in the present embodiment is a ridge waveguide optical device and is provided with a semiconductor burying layer 111, an active layer 112, a first clad layer 113, and a second clad layer 114 on a semiconductor substrate 110, as illustrated in FIG. 4 and FIG. 5A. A diffraction grating 115 is formed by forming unevenness on the surface of the semiconductor substrate 110 and burying the unevenness formed on the surface with the semiconductor burying layer 111. First burying material layers 121 and second burying material layers 122 are disposed beside both side surfaces of the second clad layer 114 disposed having a large thickness. The first burying material layers 121 are disposed beside both side surfaces of end portions in the vicinity of both ends of the second clad layer 114 disposed having a large thickness and the second burying material layers 122 are disposed beside both side surfaces of the center portion of the second clad layer 114 disposed having a large thickness. In the present embodiment, the refractive index n1 of the first burying material layer 121 is specified to become larger than the refractive index n2 of the second burying material layer 122, that is, n2<n1 is satisfied. An upper electrode 131 is disposed on the second clad layer 114 disposed having a large thickness, and a lower electrode 132 is disposed on the back of the semiconductor substrate 110. In the present embodiment, the semiconductor burying layer 111 serves as a lower clad layer, and the active layer 112 in the region provided with the second clad layer 114 serves as an optical waveguide.

Figure 5B:
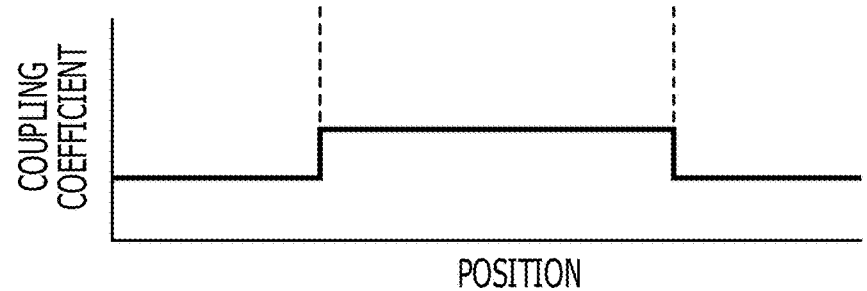

Consequently, the distribution of light propagating through the optical waveguide is attracted to the side of the second clad layer 114 disposed having a large thickness in the end portions at both ends rather than the center portion of the optical waveguide, so that, as illustrated in FIG. 5B, the coupling coefficient becomes high in the center portion of the optical waveguide and becomes low in the end portions at both ends. Therefore, in the case where the optical device according to the present embodiment is used as a FM modulation light source, the efficiency and the like of the FM modulation may be improved.

In the present embodiment, an n-InP substrate is used for the semiconductor substrate 110. The active layer 112 is a MQW active layer made from GaInAsP or the like. Well layers having a thickness of 6 nm and barrier layers having a thickness of 10 nm are disposed alternately and a four-layered well layer is disposed in such a way that the emission wavelength becomes 1.55 μm. The second clad layer 114 is made from n-InP having a width of 1.5 μm. The first burying material layer 121 is made from TiO2 having a refractive index n1 of about 2.52, and the second burying material layer 122 is made from MgF2 having a refractive index n2 of about 1.37. In the embodiments, the second clad layer 114 may be referred to as the clad layer.

[Method for Manufacturing Optical Device]

Next, a method for manufacturing an optical device according to the present embodiment will be described with reference to FIG. 6A to FIG. 10C.

Figure 6A:
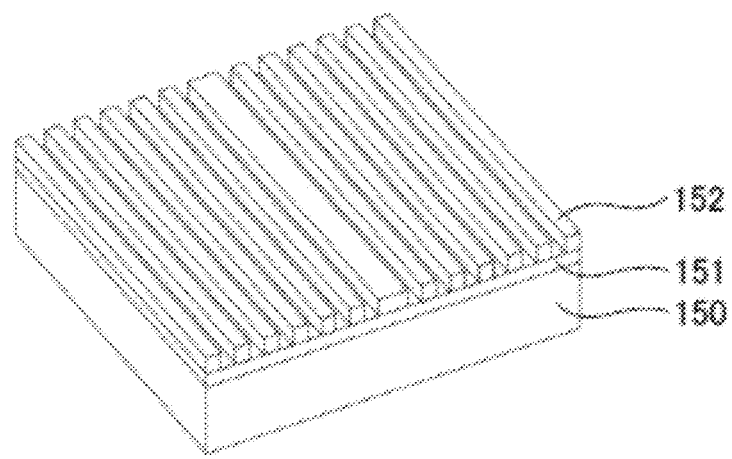
FIGS. 6A to 6C are process diagrams of a method for manufacturing the optical device according to the second embodiment.

Initially, as illustrated in FIG. 6A, an n-type doped GaInAsP layer 151 having a composition wavelength of 1.25 μm and a thickness of 30 nm is formed on an n-type doped InP substrate 150 by a metal-organic vapor phase epitaxy (MOVPE) method. Thereafter, an electron beam resist (ZEP520 produced by ZEON Corporation) is applied to the surface of the resulting n-type doped GaInAsP layer 151, and a diffraction grating mask 152 to form a diffraction grating is formed by an electron beam exposure method.

Figure 6B:
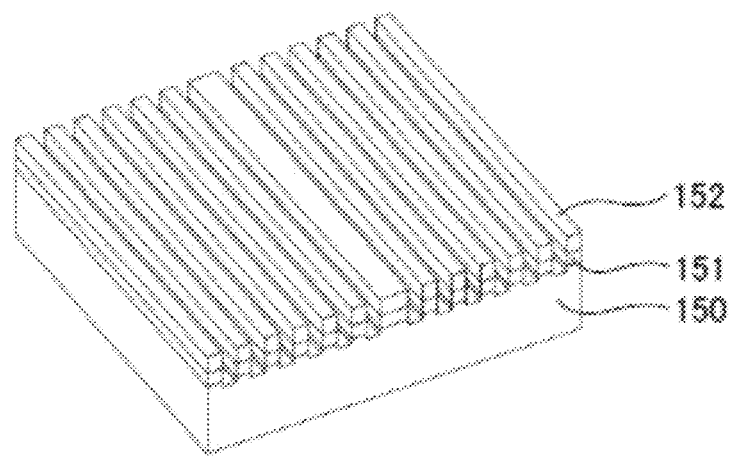

Subsequently, as illustrated in FIG. 6B, reactive ion etching (RIE) is performed using an ethane/hydrogen mixed gas, where the resulting diffraction grating mask 152 serves as a mask. Consequently, the n-type doped GaInAsP layer 151 having a composition wavelength of 1.25 μm and a thickness of 30 nm is penetrated and the surface of the n-type doped InP substrate 150 is over etched by about 15 nm.

Figure 6C:
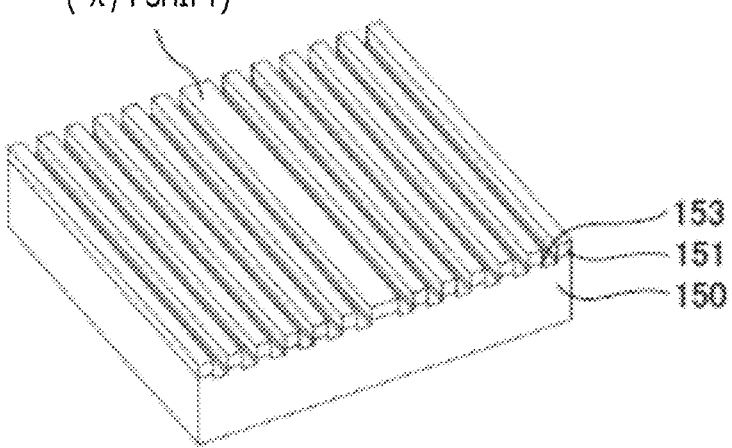

As illustrated in FIG. 6C, the diffraction grating mask 152 is peeled off. In this manner, the diffraction grating 153 is formed. In the thus formed diffraction grating 153, the phase is configured to have a phase shift of π radian at the resonator center of the device.

Figure 7A:
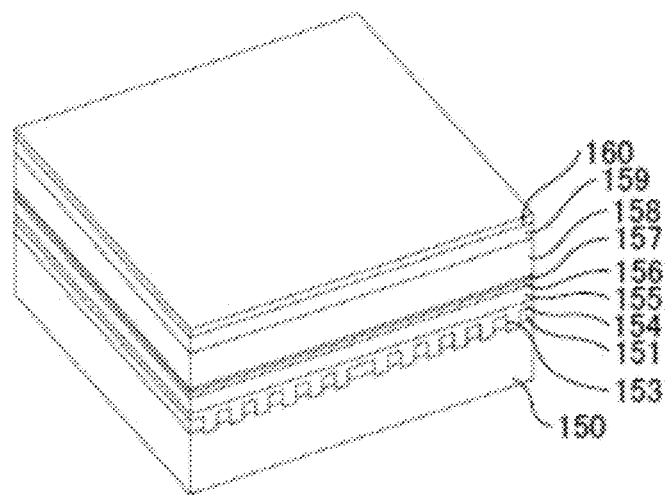
FIGS. 7A to 7C are process diagrams of the method for manufacturing the optical device according to the second embodiment.

As illustrated in FIG. 7A, an n-type doped InP layer 154 having a thickness of 60 nm is formed on the n-type doped InP substrate 150 and the n-type doped GaInAsP layer 151 constituting the surface provided with the diffraction grating 153 by MOVPE. Thereafter, a quantum well active layer 155, a p-type doped InP clad layer 156 having a thickness of 150 nm, and a p-type doped GaInAsP etch stop layer 157 having a composition wavelength of 1.1 μm and a thickness of 20 nm are formed by MOVPE. Furthermore, a p-type doped InP clad layer 158 having a thickness of 1.5 μm and a p-type doped GaInAs contact layer 159 having a thickness of 300 nm are formed on the p-type doped GaInAsP etch stop layer 157 by MOVPE. Then, a SiO2 layer 160 having a thickness of 400 nm to form an etching mask described later is formed on the p-type doped GaInAs contact layer 159 by a chemical vapor deposition (CVD) method. The quantum well active layer 155 is formed by stacking undoped GaInAsP quantum well layers having a thickness of 6 nm and an amount of compressive strain of 1.0% and undoped GaInAsP barrier layers having a composition wavelength of 1.2 μm and a thickness of 10 nm alternately.

In the present embodiment, the number of layers of quantum well layers in the quantum well active layer 155 is four layers, and the emission wavelength is 1,550 nm. These quantum well/barrier layers are sandwiched between undoped GaInAsP SCH layers having a wavelength of 1.15 μm and a thickness of 20 nm, although not illustrated in the drawing.

Figure 7B:
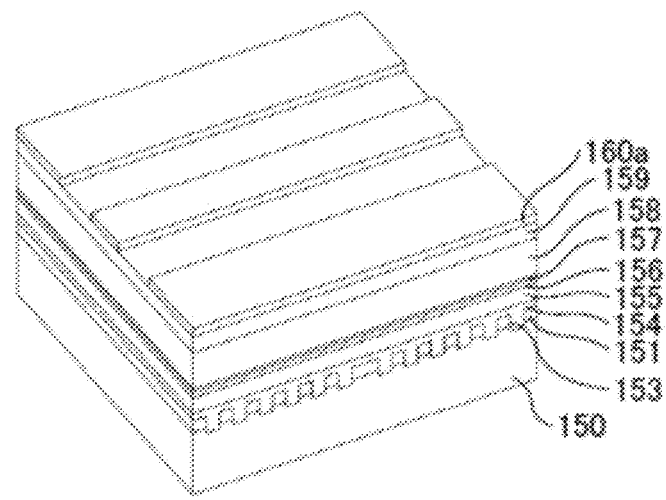

As illustrated in FIG. 7B, a stripe-shaped resist pattern, although not illustrated in the drawing, is formed by applying photoresist to the SiO2 layer 160 and inducing exposure and development by an exposure apparatus. Thereafter, the SiO2 layer 160 in the region not provided with the resist pattern is removed by wet etching, so as to form an etching mask layer 160a from SiO2. The resist pattern is removed. The thus formed etching mask layer 160a has the shape of a stripe having a width of 1.5 μm, and opening portions having a width of 6 μm are further provided.

Figure 7C:
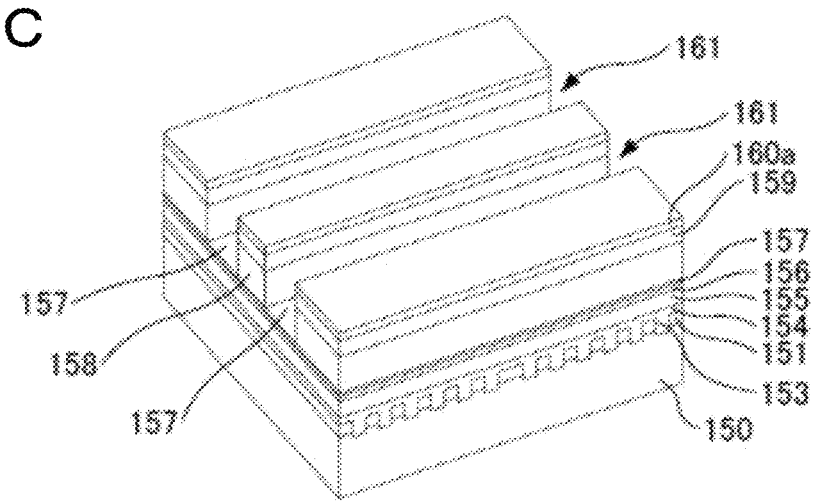

As illustrated in FIG. 7C, the p-type doped InP clad layer 158 and the p-type doped GaInAs contact layer 159 in the region not provided with the etching mask layer 160a are removed by using dry etching and wet etching in combination. This etching is stopped at the p-type doped GaInAsP etch stop layer 157. In this manner, the p-type doped InP clad layer 158 and the p-type doped GaInAs contact layer 159 are formed into the shape of a ridge stripe having a width of 1.5 μm. Trenches 161 having a width of 6 μm are formed on both sides of the p-type doped InP clad layer 158 and the p-type doped GaInAs contact layer 159 formed into the shape of a stripe.

Figure 8A:
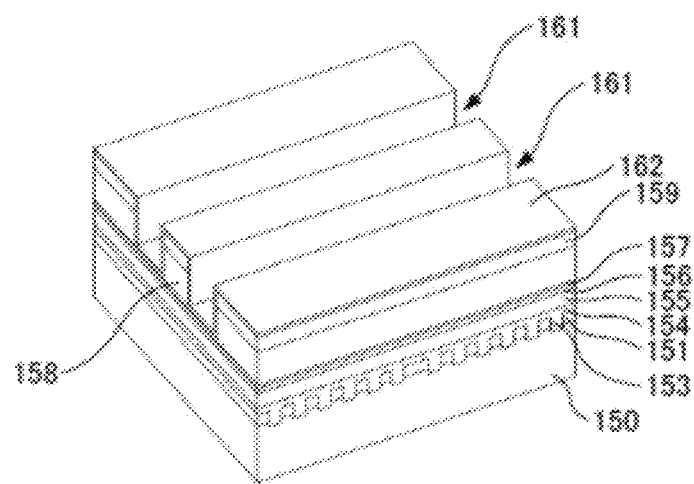
FIGS. 8A to 8C are process diagrams of the method for manufacturing the optical device according to the second embodiment.

As illustrated in FIG. 8A, the etching mask layer 160a is removed with buffered hydrofluoric acid and, thereafter, a SiN passivation film 162 having a thickness of 20 nm is formed by plasma CVD or the like.

Figure 8B:
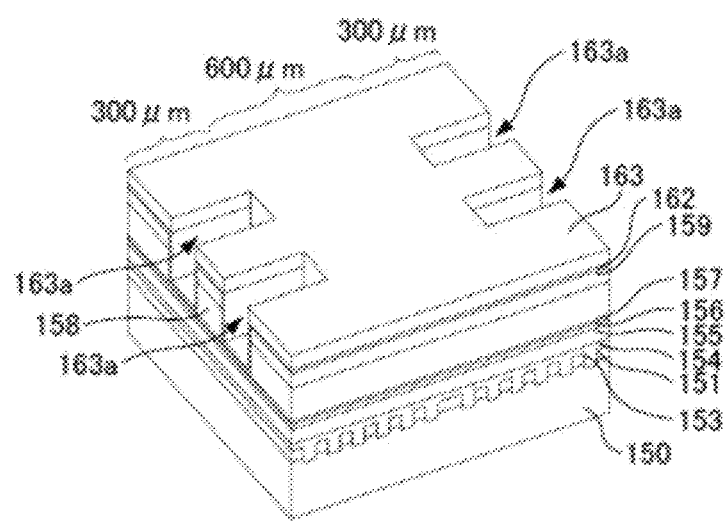

As illustrated in FIG. 8B, a resist pattern 163 having opening portions 163a in the regions to be provided with first burying material layers 164 described later in the trenches 161 is formed. Specifically, the resist pattern 163 having opening portions 163a in the regions to be provided with the first burying material layers 164 is formed by applying photoresist to the SiN passivation film 162 and inducing exposure and development by an exposure apparatus. The thus formed resist pattern 163 is provided with the openings 163a in both end portions corresponding to the end portions, which are from both ends up to 300 μm from the ends, of the trenches 161, and the center portions having a length of 600 μm of the trenches are filled with the resist pattern 163.

Figure 8C:
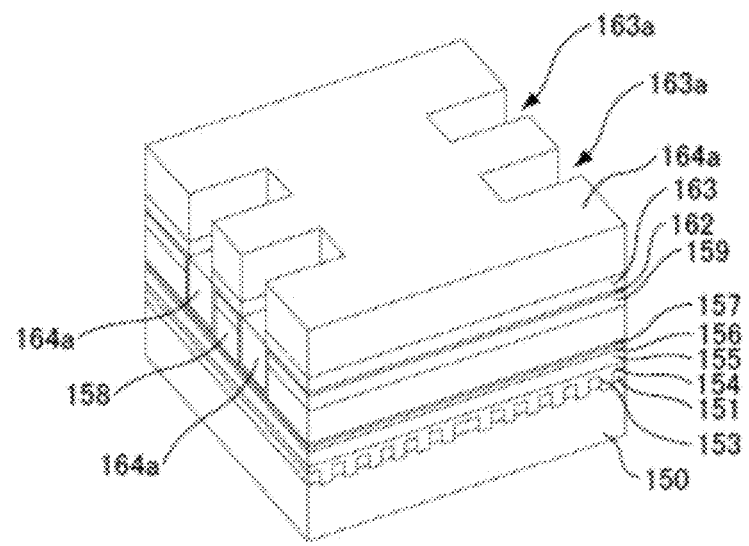

As illustrated in FIG. 8C, a TiO2 film 164a is formed on the surface provided with the resist pattern 163 until the trenches are filled by vacuum evaporation or the like.

Figure 9A:
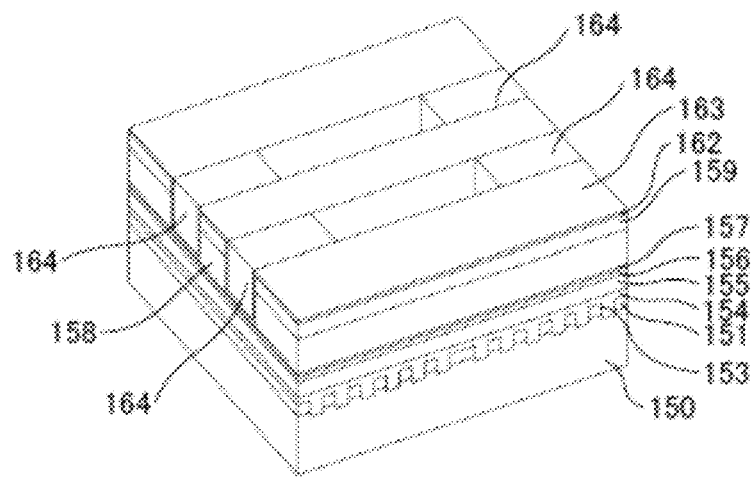
FIGS. 9A to 9C are process diagrams of the method for manufacturing the optical device according to the second embodiment.

As illustrated in FIG. 9A, the TiO2 film 164a formed on the resist pattern 163 is removed together with the resist pattern 163 by lift-off through dipping into an organic solvent or the like. In this manner, the first burying material layers 164 are formed from the TiO2 film 164a remaining in the trenches.

Figure 9B:
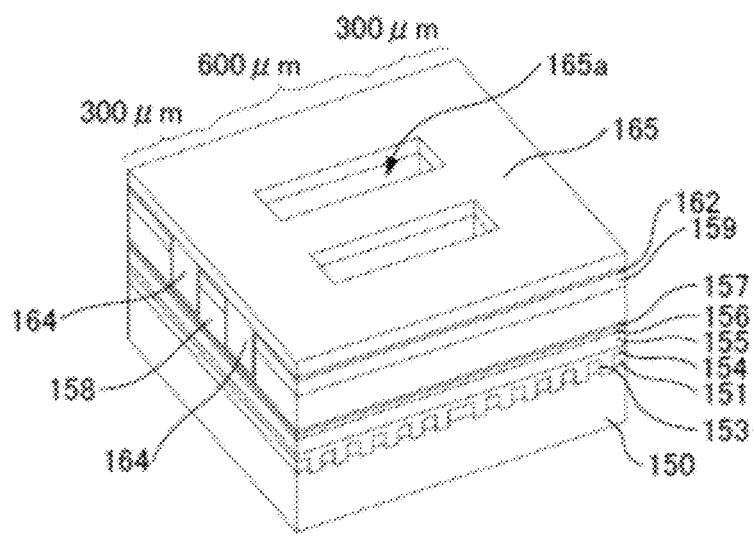

As illustrated in FIG. 9B, a resist pattern 165 having opening portions 165a in the regions to be provided with second burying material layers 166 described later, that is, the regions not provided with the first burying material layers 164 in the trenches, is formed. Specifically, the resist pattern 165 having opening portions 165a in the regions to be provided with the second burying material layers 166 is formed by applying photoresist to the first burying material layers 164, the SiN passivation film 162, and the like and inducing exposure and development by an exposure apparatus. The thus formed resist pattern 165 is provided with the openings 165a having a length of 600 μm in the center portions.

Figure 9C:
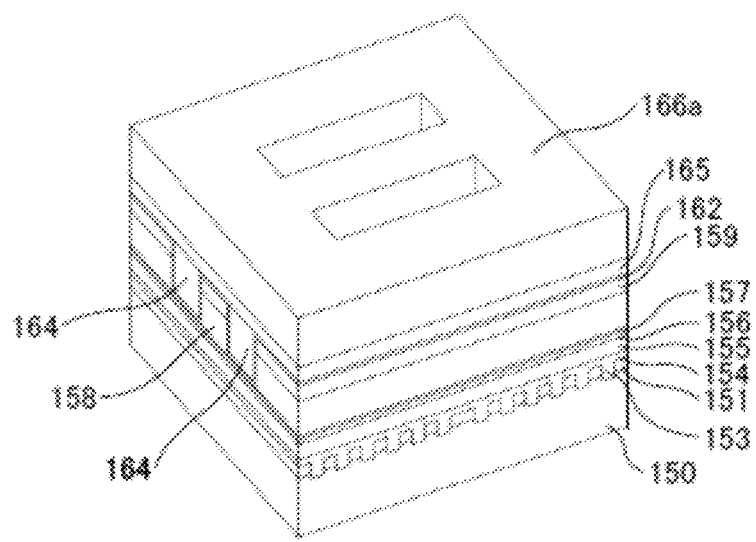

As illustrated in FIG. 9C, a MgF2 film 166a is formed on the surface provided with the resist pattern 165 until the trenches are filled by vacuum evaporation or the like.

Figure 10A:
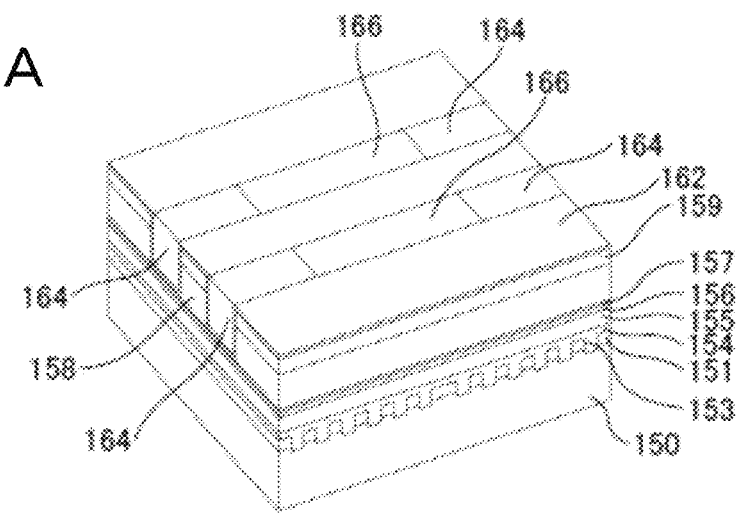
FIGS. 10A to 10C are process diagrams of the method for manufacturing the optical device according to the second embodiment.

As illustrated in FIG. 10A, the MgF2 film 166a formed on the resist pattern 165 is removed together with the resist pattern 165 by lift-off through dipping into an organic solvent or the like. Consequently, the second burying material layers 166 are formed from the MgF2 film 166a remaining in the trenches. In this manner, beside both side surfaces of the p-type doped InP clad layer 158, the second burying material layers 166 made from MgF2 having a length of 600 μm are formed in the center portions and the first burying material layers 164 made from TiO2 having a length of 300 μm are formed in both end portions in contact with the center portions.

Figure 10B:
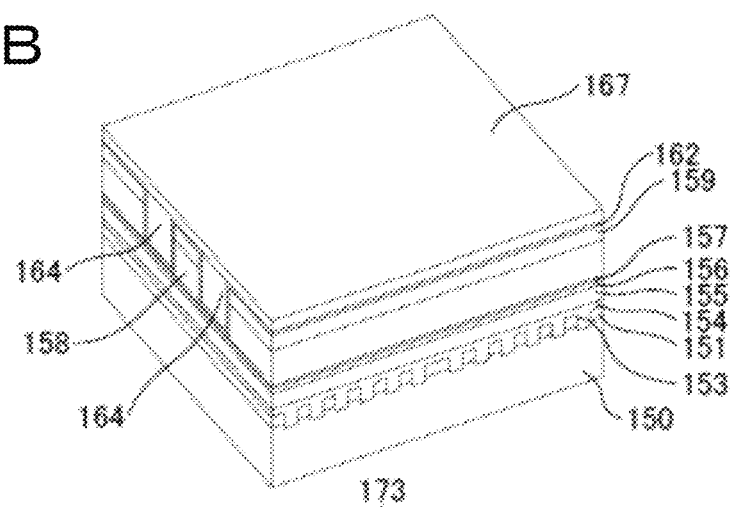

As illustrated in FIG. 10B, a SiN passivation film 167 having a thickness of 600 nm is formed on the first burying material layers 164, the second burying material layers 166, and the SiN passivation film 162 by plasma CVD or the like.

Figure 10C:
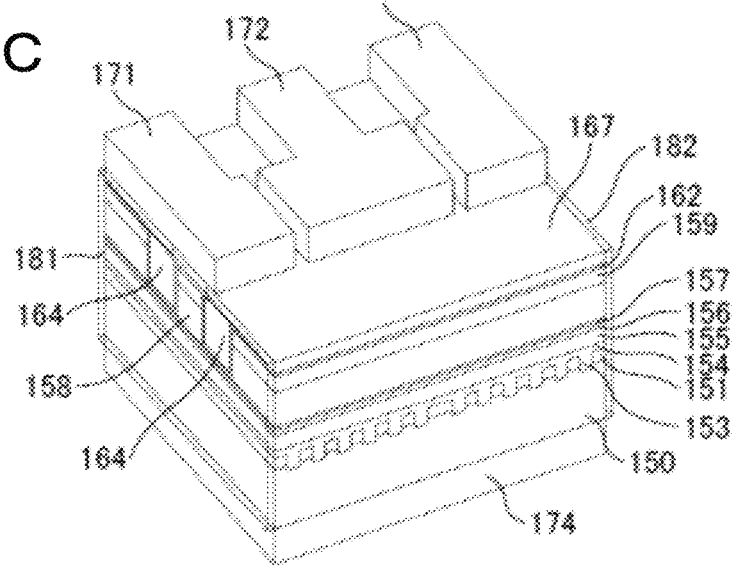

As illustrated in FIG. 10C, the SiN passivation film 162 and the SiN passivation film 167 are removed, as occasion calls, to expose the p-type doped GaInAs contact layer 159, and p-electrodes 171, 172, and 173 are formed. An n-electrode 174 is formed on the back of the n-type doped InP substrate 150. In addition, nonreflective coating films (antireflective films) 181 and 182 are formed from a single-layer or multilayer dielectric film on both end surfaces of the laser, so that an optical device according to the present embodiment is produced.

In FIG. 6A to FIG. 10C, the n-type doped InP substrate 150 corresponds to the semiconductor substrate 110 in FIG. 4 and FIG. 5A, the n-type doped InP layer 154 corresponds to the semiconductor burying layer 111, and the quantum well active layer 155 corresponds to the active layer 112. The p-type doped InP clad layer 156 corresponds to the first clad layer 113, the p-type doped InP clad layer 158 corresponds to the second clad layer 114, the p-electrodes 171, 172, and 173 correspond to the upper electrode 131, and the n-electrode 174 corresponds to the lower electrode 132. The first burying material layer 164 corresponds to the first burying material layer 121 and the second burying material layer 166 corresponds to the second burying material layer 122.

In the optical device according to the present embodiment, the normalized coupling coefficient κL of the first burying material layer 164 filled with TiO2 in both end portions of the trench is 2. The normalized coupling coefficient κL of the second burying material layer 166 filled with MgF2 in the center portion of the trench is 4. The first burying material layers 164 are formed by filling the trench with TiO2 in such a way that the proportions of the lengths of both end portions relative to the whole length of the resonator become 0.25. Therefore, the value of normalized threshold gain difference between the main mode and the side mode in the longitudinal mode becomes 1.4 and is about two times that of a common λ/4 shift DFB laser of 0.72 and, thereby, the mode stability is basically enhanced. Consequently, even when this semiconductor laser serving as an optical device is used as a MF modulation light source or a tunable light source and a current value to drive the center electrode 172 of three-way split p-electrodes 171, 172, and 173 is changed, lasing may be maintained in a single mode stably without mode-hopping.

The contents other than those described above are the same as the first embodiment.

Third Embodiment

[Optical Device]

Figure 11:
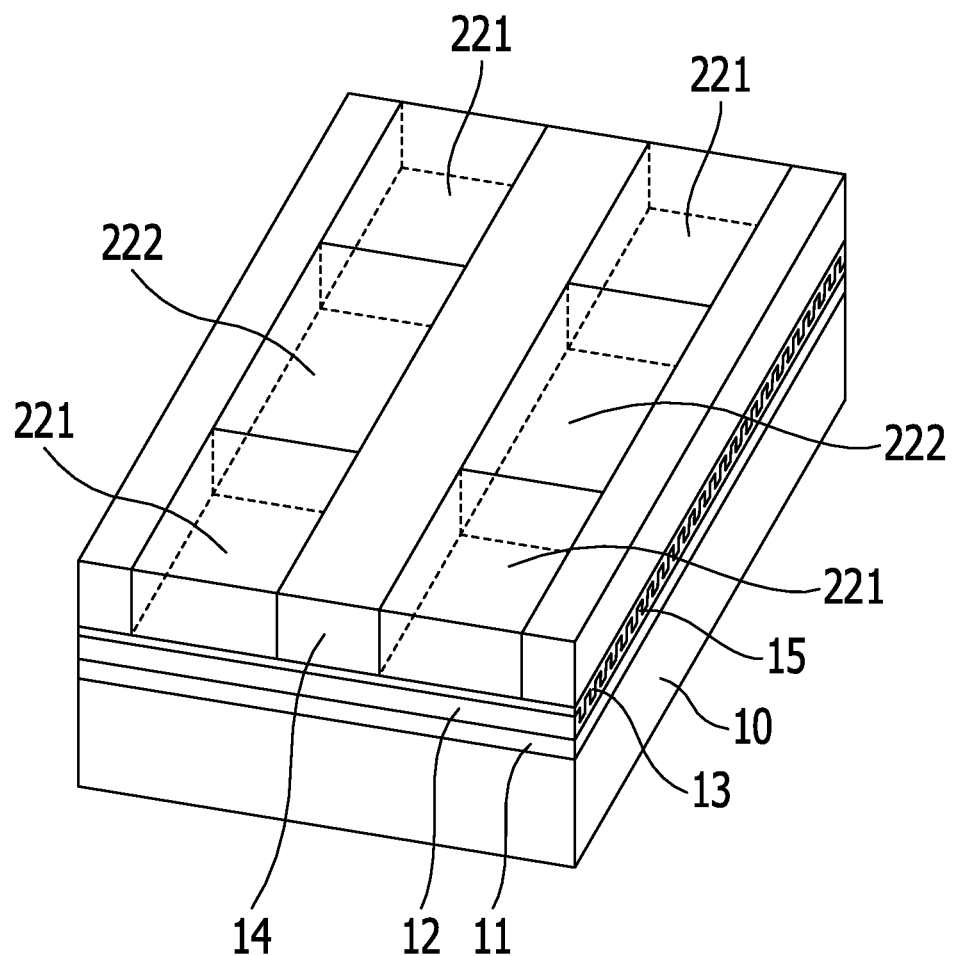
FIG. 11 is a perspective view of a key portion of an optical device according to a third embodiment.
Figure 12A:
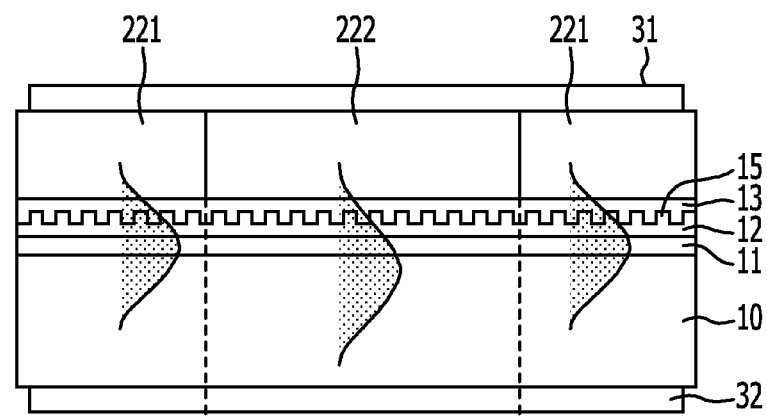
FIGS. 12A and 12B are explanatory diagrams of the optical device according to the third embodiment.

A third embodiment will be described. An optical device in the present embodiment is provided with an active layer 11, a diffraction grating layer 12, a semiconductor burying layer 13, and a clad layer 14 on a semiconductor substrate 10, as illustrated in FIG. 11 and FIG. 12A. A diffraction grating 15 is formed by forming unevenness on the surface of the diffraction grating layer 12 and burying the unevenness formed on the surface with the semiconductor burying layer 13. First burying material layers 221 and second burying material layers 222 are disposed beside both side surfaces of the clad layer 14 disposed having a large thickness. The first burying material layers 221 are disposed beside both side surfaces of both end portions, which have a predetermined length from the end, of the clad layer 14 disposed having a large thickness and the second burying material layers 222 are disposed beside both side surfaces of the center portion of the clad layer 14. In the present embodiment, the refractive index n1 of the first burying material layer 221 is specified to become larger than the refractive index n2 of the second burying material layer 222, that is, n2<n1 is satisfied. An upper electrode 31 is disposed on the clad layer 14 disposed having a large thickness, and a lower electrode 32 is disposed on the back of the semiconductor substrate 10. In the present embodiment, the semiconductor substrate 10 functions as a lower clad layer, and the active layer 11 in the region provided with the clad layer 14 serves as an optical waveguide.

Figure 12B:
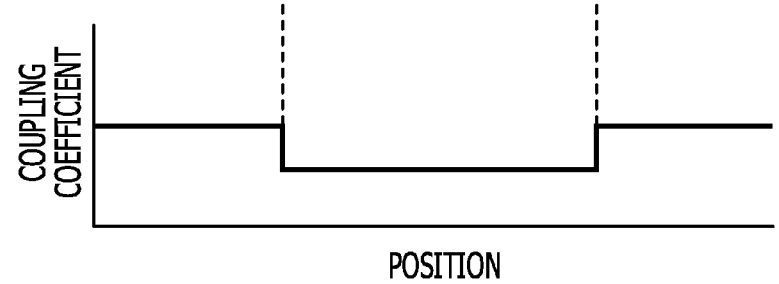

Consequently, the distribution of light propagating through the optical waveguide is attracted to the side of the clad layer 14 disposed having a large thickness in the end portions at both ends rather than the center portion of the optical waveguide, so that, as illustrated in FIG. 12B, the coupling coefficient becomes low in the center portion of the optical waveguide and becomes high in the end portions at both ends. Therefore, in the case where the optical device according to the present embodiment is used as a semiconductor laser, for example, hole burning may be suppressed even when the drive current is increased.

In the present embodiment, an n-InP substrate is used for the semiconductor substrate 10. The active layer 11 is a MQW active layer made from GaInAsP or the like. Well layers having a thickness of 6 nm and barrier layers having a thickness of 10 nm are disposed alternately and a four-layered well layer is disposed in such a way that the emission wavelength becomes 1.55 μm. The thickness of the diffraction grating layer 12 and the semiconductor burying layer 13 constituting the diffraction grating 15 is 30 nm and the diffraction grating layer 12 is disposed in such a way that the composition wavelength becomes 1.18 μm. The clad layer 14 is made from n-InP having a width of 1.5 μm. The first burying material layer 221 is made from TiO2 having a refractive index n1 of about 2.52, and the second burying material layer 222 is made from MgF2 having a refractive index n2 of about 1.37.

[Method for Manufacturing Optical Device]

Next, a method for manufacturing an optical device according to the present embodiment will be described with reference to FIG. 13A to FIG. 17C.

Figure 13A:
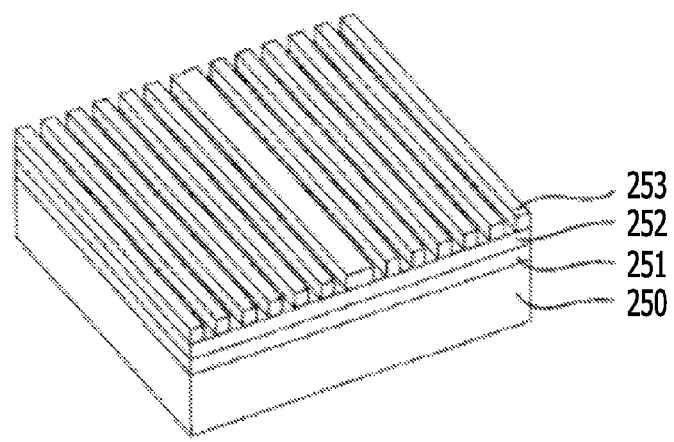
FIGS. 13A to 13C are process diagrams of a method for manufacturing the optical device according to the third embodiment.

Initially, as illustrated in FIG. 13A, a quantum well active layer 251 and an n-type doped GaInAsP layer 252 having a composition wavelength of 1.2 μm and a thickness of 60 nm are formed on an n-type doped InP substrate 250 by a metal-organic vapor phase epitaxy (MOVPE) method.

Thereafter, an electron beam resist (ZEP520 produced by ZEON Corporation) is applied to the surface of the resulting n-type doped GaInAsP layer 252, and a diffraction grating mask 253 to form a diffraction grating is formed by an electron beam exposure method. The quantum well active layer 251 is formed by stacking undoped GaInAsP quantum well layers having a thickness of 6 nm and an amount of compressive strain of 1.0% and undoped GaInAsP barrier layers having a composition wavelength of 1.2 μm and a thickness of 10 nm alternately. In the present embodiment, the number of layers of quantum well layers in the quantum well active layer 251 is four layers, and the emission wavelength is 1,550 nm. These quantum well/barrier layers are sandwiched between undoped GaInAsP SCH layers having a wavelength of 1.15 μm and a thickness of 20 nm, although not illustrated in the drawing.

Figure 13B:
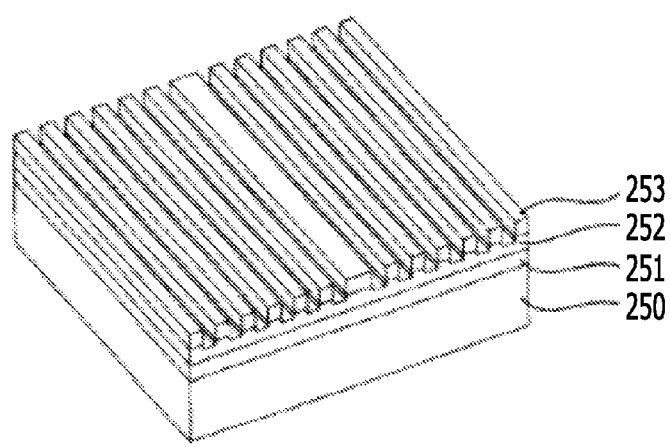

Subsequently, as illustrated in FIG. 13B, reactive ion etching (RIE) is performed using an ethane/hydrogen mixed gas, where the resulting diffraction grating mask 253 serves as a mask. Consequently, the n-type doped GaInAsP layer 252 in the region not provided with the diffraction grating mask 253 is removed by a depth of 30 nm.

Figure 13C:
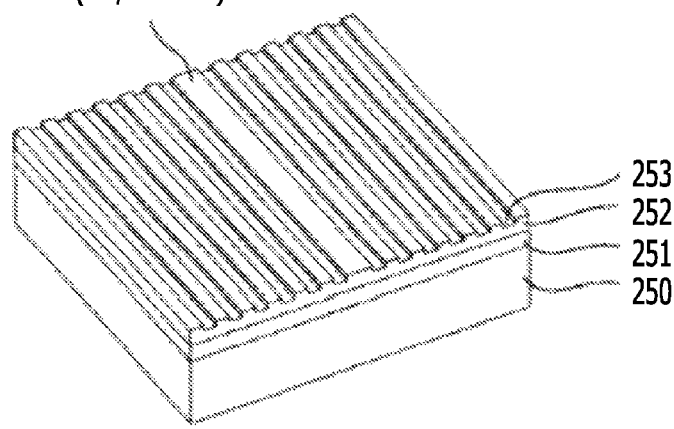

As illustrated in FIG. 13C, the diffraction grating mask 253 is peeled off. In this manner, the diffraction grating 254 is formed on the surface of the n-type doped GaInAsP layer 252. In the thus formed diffraction grating 254, the phase is configured to have a phase shift of π radian at the resonator center of the device. In the present embodiment, the n-type doped GaInAsP layer 252 provided with the diffraction grating 254 on the surface may be referred to as a diffraction grating layer.

Figure 14A:
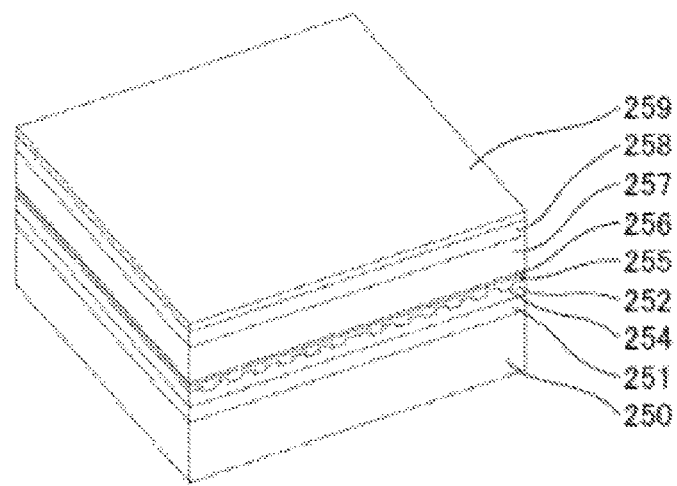
FIGS. 14A to 14C are process diagrams of the method for manufacturing the optical device according to the third embodiment.

As illustrated in FIG. 14A, a p-type doped InP layer 255 is formed on the n-type doped GaInAsP layer 252 provided with the diffraction grating 254, and a p-type doped GaInAsP etch stop layer 256 is formed on the p-type doped InP layer 255. The p-type doped InP layer 255 and the p-type doped GaInAsP etch stop layer 256 are formed by MOVPE. The resulting p-type doped InP layer 255 has a thickness of 150 nm and the p-type doped GaInAsP etch stop layer 256 has a composition wavelength of 1.1 μm and a thickness of 20 nm. Furthermore, a p-type doped InP clad layer 257 having a thickness of 1.5 μm and a p-type doped GaInAs contact layer 258 having a thickness of 300 nm are formed on the p-type doped GaInAsP etch stop layer 256 by MOVPE. Thereafter, a SiO2 layer 259 having a thickness of 400 nm to form an etching mask described later is formed on the p-type doped GaInAs contact layer 258 by a chemical vapor deposition (CVD) method.

Figure 14B:
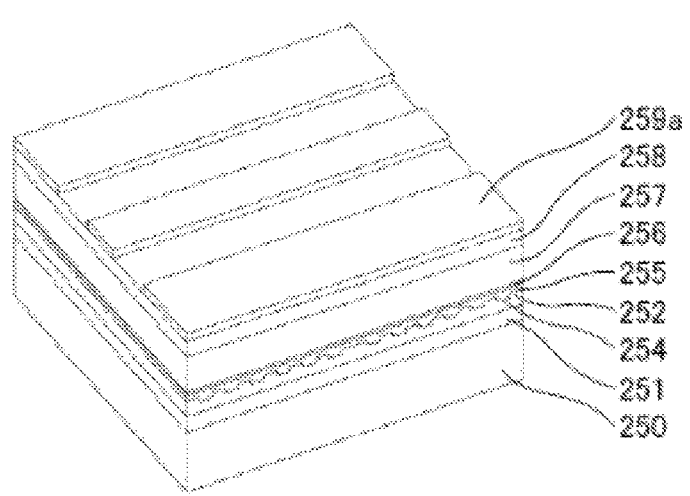

As illustrated in FIG. 14B, a stripe-shaped resist pattern, although not illustrated in the drawing, is formed by applying photoresist to the SiO2 layer 259 and inducing exposure and development by an exposure apparatus. Thereafter, the SiO2 layer 259 in the region not provided with the resist pattern is removed by wet etching, so as to form an etching mask layer 259a from SiO2. The resist pattern is removed. The thus formed etching mask layer 259a has the shape of a stripe having a width of 1.5 μm, and opening portions having a width of 6 μm are further provided.

Figure 14C:
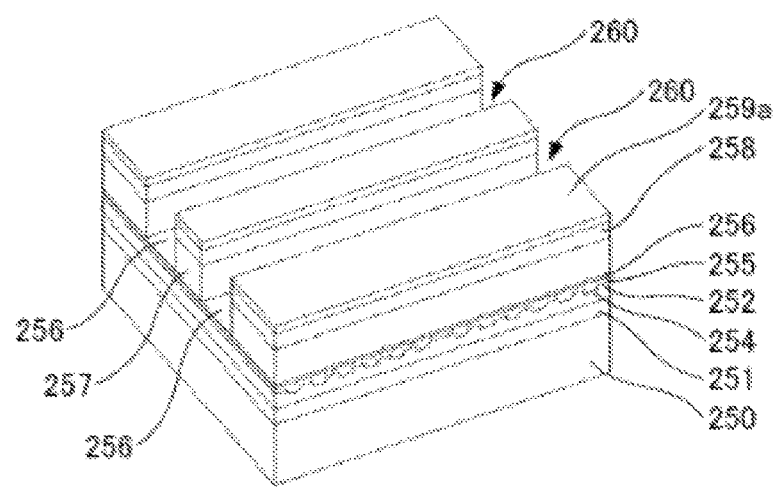

As illustrated in FIG. 14C, the p-type doped InP clad layer 257 and the p-type doped GaInAs contact layer 258 in the region not provided with the etching mask layer 259a are removed by using dry etching and wet etching in combination. This etching is stopped at the p-type doped GaInAsP etch stop layer 256. In this manner, the p-type doped InP clad layer 257 and the p-type doped GaInAs contact layer 258 are formed into the shape of a ridge stripe having a width of 1.5 μm. Trenches 260 having a width of 6 μm are formed on both sides of the p-type doped InP clad layer 257 and the p-type doped GaInAs contact layer 258 formed into the shape of a stripe.

Figure 15A:
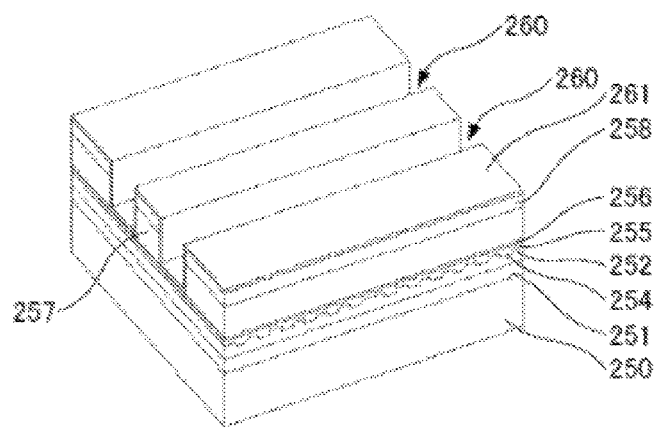
FIGS. 15A to 15C are process diagrams of the method for manufacturing the optical device according to the third embodiment.

As illustrated in FIG. 15A, the etching mask layer 259a is removed with buffered hydrofluoric acid and, thereafter, a SiN passivation film 261 having a thickness of 20 nm is formed by plasma CVD or the like.

Figure 15B:
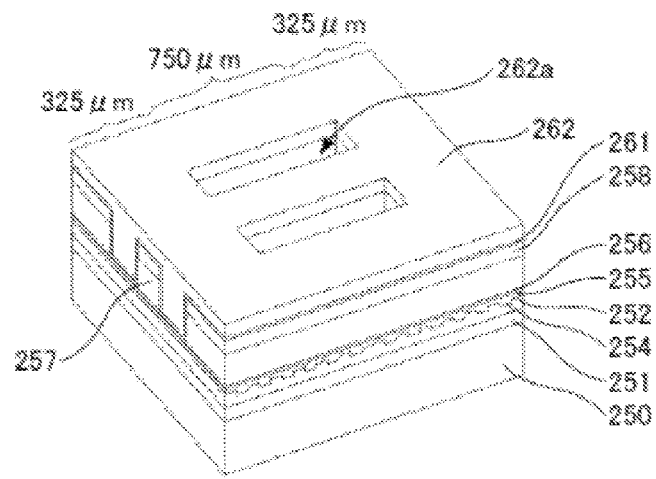

As illustrated in FIG. 15B, a resist pattern 262 having opening portions 262a in the regions to be provided with second burying material layers 263 described later in the trenches 260 is formed. Specifically, the resist pattern 262 having opening portions 262a in the regions to be provided with the second burying material layers 263 is formed by applying photoresist to the SiN passivation film 261 and inducing exposure and development by an exposure apparatus. The thus formed resist pattern 262 is provided with the openings 262a in the center portions having a length of 750 μm of the trenches 260 and both end portions corresponding to the end portions, which are from both ends up to 325 μm from the ends, of the trenches 260, are filled with the resist pattern 262.

Figure 15C:
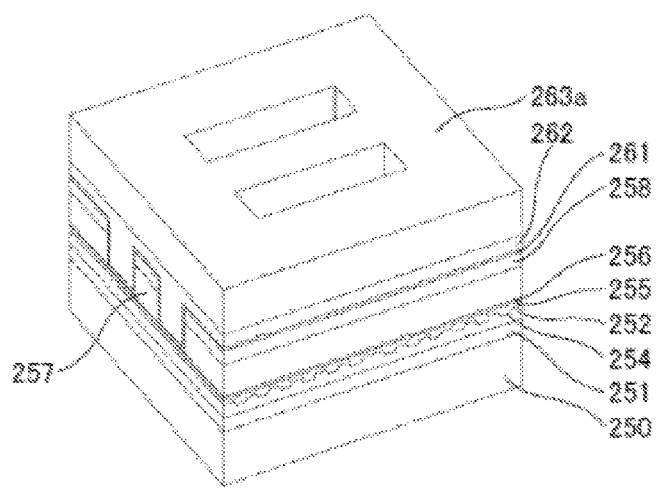

As illustrated in FIG. 15C, a MgF2 film 263a is formed on the surface provided with the resist pattern 262 until the trenches are filled by vacuum evaporation or the like.

Figure 16A:
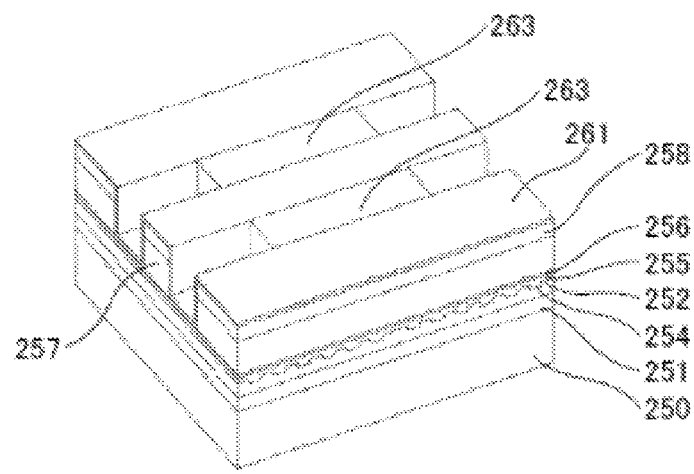
FIGS. 16A to 16C are process diagrams of the method for manufacturing the optical device according to the third embodiment.

As illustrated in FIG. 16A, the MgF2 film 263a formed on the resist pattern 262 is removed together with the resist pattern 262 by lift-off through dipping into an organic solvent or the like. In this manner, the second burying material layers 263 are formed from the MgF2 film 263a remaining in the trenches.

Figure 16B:
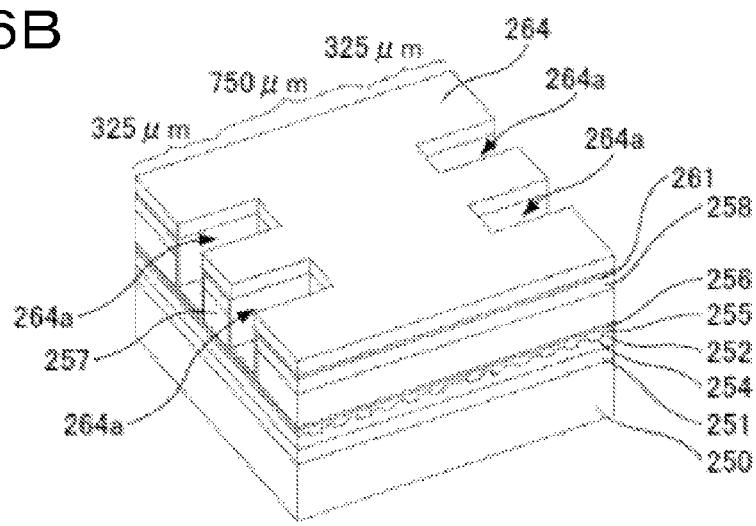

As illustrated in FIG. 16B, a resist pattern 264 having opening portions 264a in the regions to be provided with first burying material layers 265, that is, the regions not provided with the second burying material layers 263 in the trenches, is formed. Specifically, the resist pattern 264 having opening portions 264a in the regions to be provided with the first burying material layers 265 is formed by applying photoresist to the second burying material layers 263, the SiN passivation film 261, and the like and inducing exposure and development by an exposure apparatus. The thus formed resist pattern 264 is provided with the openings 264a having a length of 325 μm in both end portions.

Figure 16C:
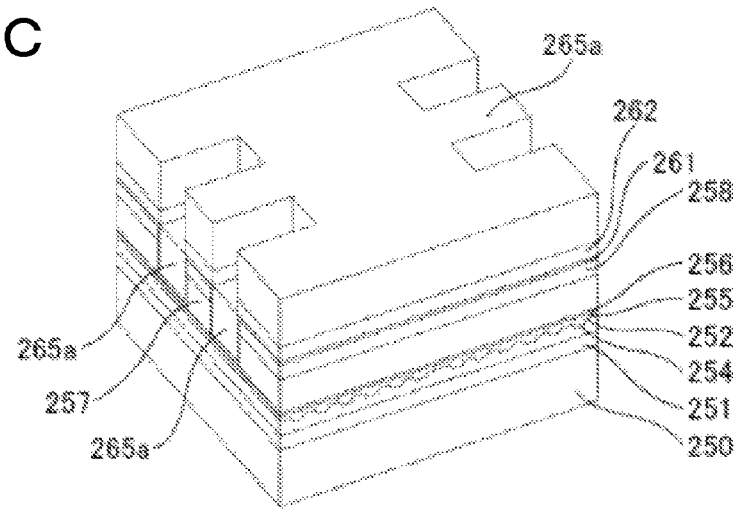

As illustrated in FIG. 16C, a TiO2 film 265a is formed on the surface provided with the resist pattern 264 until the trenches are filled by vacuum evaporation or the like.

Figure 17A:
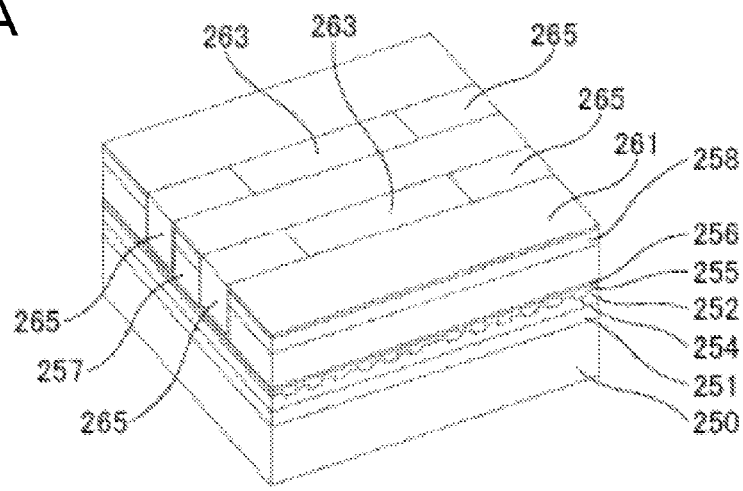
FIGS. 17A to 17C are process diagrams of the method for manufacturing the optical device according to the third embodiment.

As illustrated in FIG. 17A, the TiO2 film 265a formed on the resist pattern 264 is removed together with the resist pattern 264 by lift-off through dipping into an organic solvent or the like. Consequently, the first burying material layers 265 are formed from the TiO2 film 265a remaining in the trenches. In this manner, beside both side surfaces of the p-type doped InP clad layer 257, the second burying material layers 263 made from MgF2 having a length of 600 μm are formed in the center portions and the first burying material layers 265 made from TiO2 having a length of 300 μm are formed in both end portions in contact with the center portions.

Figure 17B:
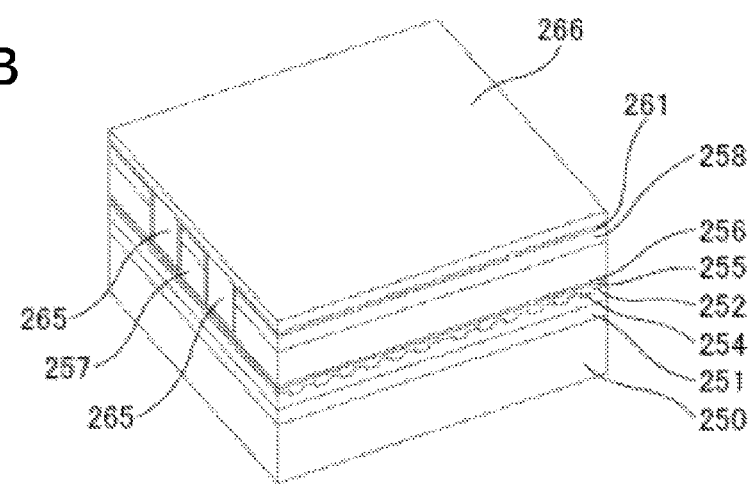

As illustrated in FIG. 17B, a SiN passivation film 266 having a thickness of 600 nm is formed on the first burying material layers 265, the second burying material layers 263, and the SiN passivation film 261 by plasma CVD or the like.

Figure 17C:
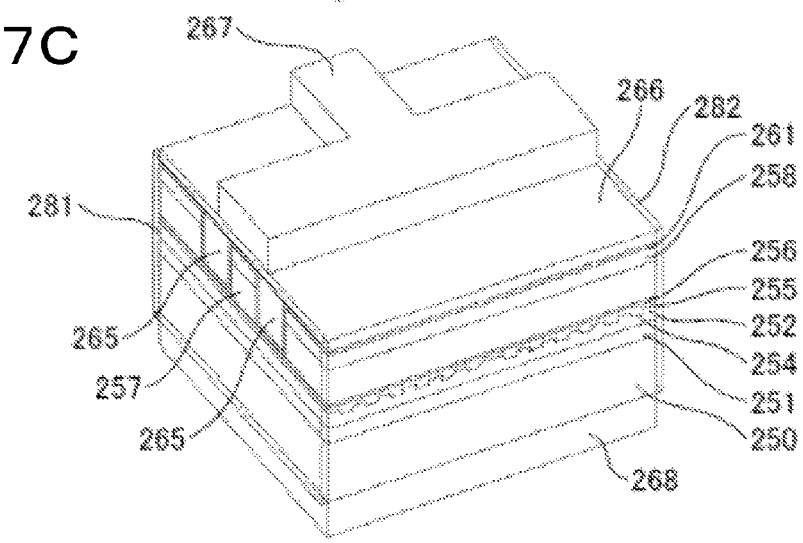

As illustrated in FIG. 17C, the SiN passivation film 261 and the SiN passivation film 266 are removed, as occasion calls, to expose the p-type doped GaInAs contact layer 258, and a p-electrode 267 is formed. An n-electrode 268 is formed on the back of the n-type doped InP substrate 250. In addition, nonreflective coating films (antireflective films) 281 and 282 are formed from a single-layer or multilayer dielectric film on both end surfaces of the laser, so that an optical device according to the present embodiment is produced.

In FIG. 13A to FIG. 17C, the n-type doped InP substrate 250 corresponds to the semiconductor substrate 10 in FIG. 11 and FIG. 12A, the quantum well active layer 251 corresponds to the active layer 11, and the n-type doped GaInAsP layer 252 corresponds to the diffraction grating layer 12. The p-type doped InP layer 255 corresponds to the semiconductor burying layer 13, the p-type doped InP clad layer 257 corresponds to the clad layer 14, the p-electrode 267 corresponds to the upper electrode 31, and the n-electrode 268 corresponds to the lower electrode 32. The first burying material layer 265 corresponds to the first burying material layer 221 and the second burying material layer 263 corresponds to the second burying material layer 222.

In the optical device according to the present embodiment, the normalized coupling coefficient κL of the first burying material layer 265 filled with TiO2 in both end portions of the trench is 1.5. The normalized coupling coefficient κL of the second burying material layer 263 filled with MgF2 in the center portion of the trench is 3. The first burying material layers 265 are formed by filling the trench with TiO2 in such a way that the proportions of the lengths of both end portions relative to the whole length of the resonator become 0.25. Therefore, the distribution of light along the resonator is flatter than that of a common laser and, thereby, the hole burning is suppressed even when the drive current is increased. Consequently, lasing may be maintained in a single mode stably without mode-hopping, while the width of lasing spectral line of the laser light is reduced to about 100 kHz.

The contents other than those described above are the same as the first embodiment. In the method for manufacturing the optical device in the present embodiment, the optical device according to the first embodiment is produced by switching the material for the first burying material layer and the material for the second burying material layer to each other.

Fourth Embodiment
[Optical Device]

Figure 18:
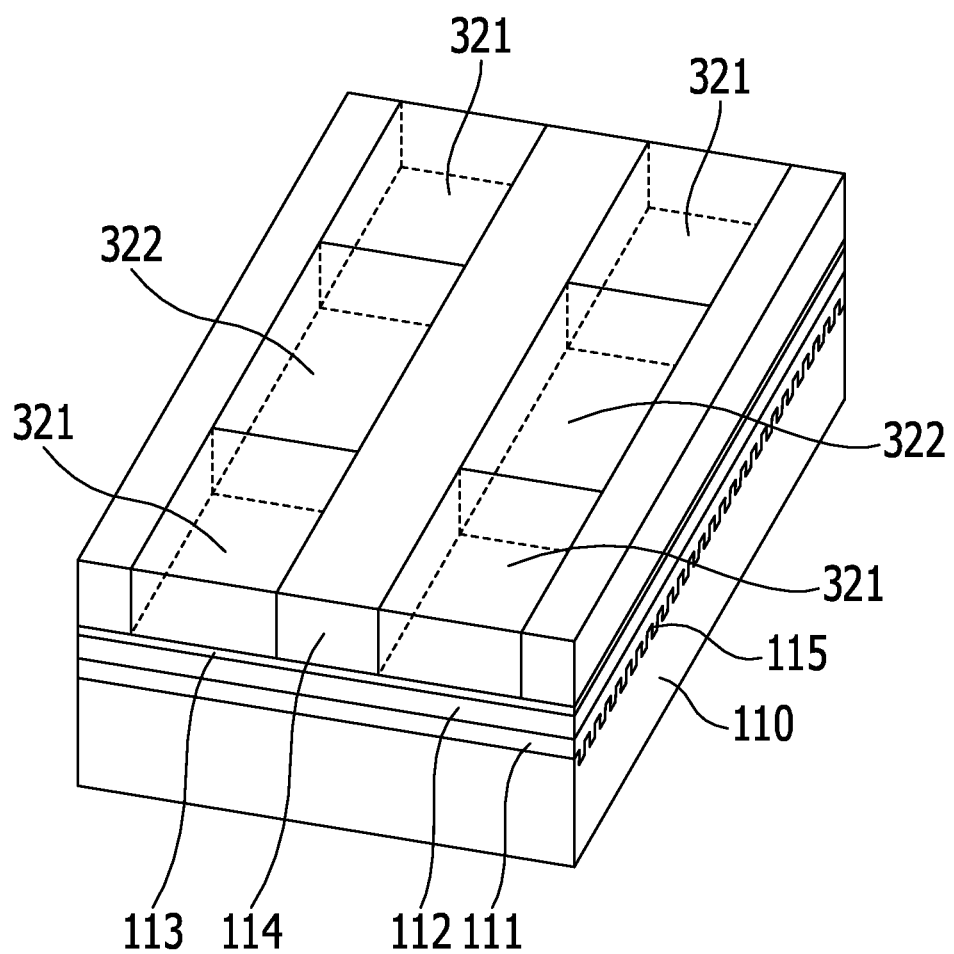
FIG. 18 is a perspective view of a key portion of an optical device according to a fourth embodiment.
Figure 19A:
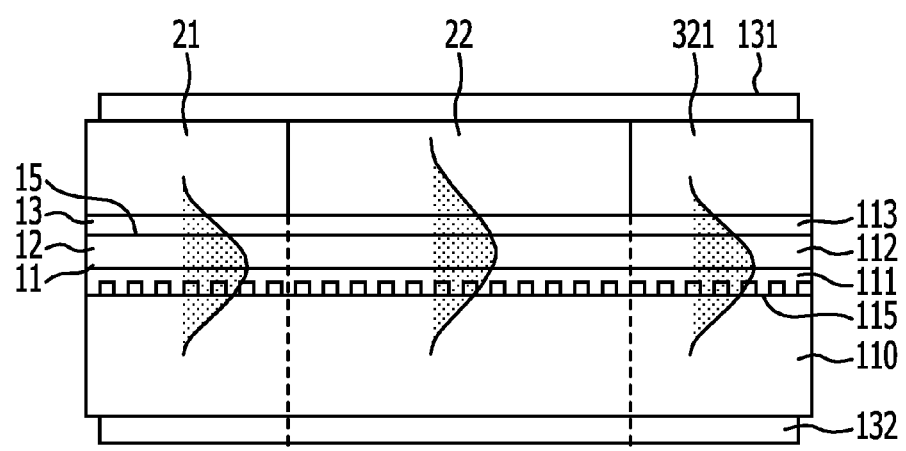
FIGS. 19A and 19B are explanatory diagrams of the optical device according to the fourth embodiment.

A fourth embodiment will be described. An optical device in the present embodiment is provided with a semiconductor burying layer 111, an active layer 112, a first clad layer 113, and a second clad layer 114 on a semiconductor substrate 110, as illustrated in FIG. 18 and FIG. 19A. A diffraction grating 115 is formed by forming unevenness on the surface of the semiconductor substrate 110 and burying the unevenness formed on the surface with the semiconductor burying layer 111. First burying material layers 321 and second burying material layers 322 are disposed beside both side surfaces of the second clad layer 114 disposed having a large thickness. The first burying material layers 321 are disposed beside both side surfaces of end portions in the vicinity of both ends of the second clad layer 114 disposed having a large thickness and the second burying material layers 322 are disposed beside both side surfaces of the center portion of the second clad layer 114 disposed having a large thickness. In the present embodiment, the refractive index n1 of the first burying material layer 321 is specified to become smaller than the refractive index n2 of the second burying material layer 322, that is, n2>n1 is satisfied. An upper electrode 131 is disposed on the second clad layer 114 disposed having a large thickness, and a lower electrode 132 is disposed on the back of the semiconductor substrate 110. In the present embodiment, the semiconductor burying layer 111 serves as a lower clad layer, and the active layer 112 in the region provided with the second clad layer 114 serves as an optical waveguide.

Figure 19B:
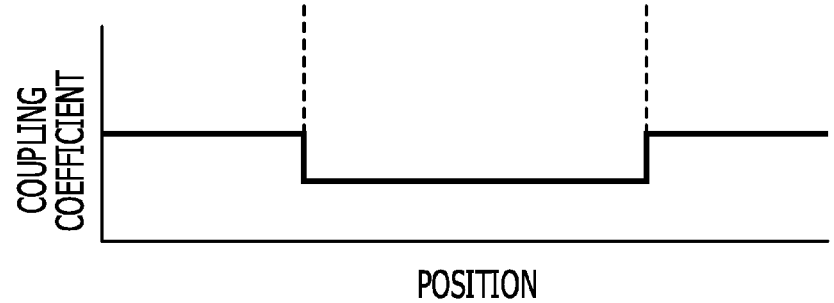

Consequently, the distribution of light propagating through the optical waveguide is attracted to the side of the second clad layer 114 disposed having a large thickness in the center portion rather than the end portions at both ends of the optical waveguide, so that, as illustrated in FIG. 19B, the coupling coefficient becomes low in the center portion of the optical waveguide and becomes high in the end portions at both ends. Therefore, in the case where the optical device according to the present embodiment is used as a semiconductor laser, for example, hole burning may be suppressed even when the drive current is increased.

In the present embodiment, an n-InP substrate is used for the semiconductor substrate 110. The active layer 112 is a MQW active layer made from GaInAsP or the like. Well layers having a thickness of 6 nm and barrier layers having a thickness of 10 nm are disposed alternately and a four-layered well layer is disposed in such a way that the emission wavelength becomes 1.55 µm. The second clad layer 114 is made from n-InP having a width of 1.5 µm. The first burying material layer 321 is made from MgF2 having a refractive index n1 of about 1.37, and the second burying material layer 322 is made from TiO2 having a refractive index n2 of about 2.52.

The contents other than those described above are the same as the second embodiment. In the second embodiment, the optical device according to the present embodiment is produced by switching the material for the first burying material layer and the material for the second burying material layer to each other.

Fifth Embodiment

Next, a fifth embodiment will be described. The present embodiment is an optical module incorporated with the optical device according to the third or fourth embodiment. Specifically, as illustrated in FIG. 20, a transmitter module portion 430 and a receiver module portion 440 are included, and the transmitter module portion 430 and the receiver module portion 440 are connected by an optical fiber 450.

The transmitter module portion 430 includes a semiconductor laser 431, a driver IC 432 to drive the semiconductor laser 431, a monitor light-receiving element 433 to monitor light emission of the semiconductor laser 431, an isolator 434, a lens 435, and the like. In the present embodiment, the optical device according to the third or fourth embodiment is used for the semiconductor laser 431. In the transmitter module portion 430, laser light emitted from the semiconductor laser 431 driven by the driver IC 432 enters from one end portion 450a of the optical fiber 450 through the isolator 434 and the lens 435.

The receiver module portion 440 includes a light-receiving element 441, for example, a photodetector, a driver IC 442 to, for example, drive the light-receiving element 441, a lens 443, and the like. The laser light incident on the one end portion 450a of the optical fiber 450 from the transmitter module portion 430 propagates through the inside of the optical fiber 450 and outgoes from the other end portion 450b of the optical fiber 450. The laser light outgoing from the other end portion 450b of the optical fiber 450 enters the receiver module portion 440 and enters the light-receiving element 441 through the lens 443 in the receiver module portion 440. In the light-receiving element 441, the incident light is converted to an electric signal in accordance with the intensity.

Sixth Embodiment

Figure 21:
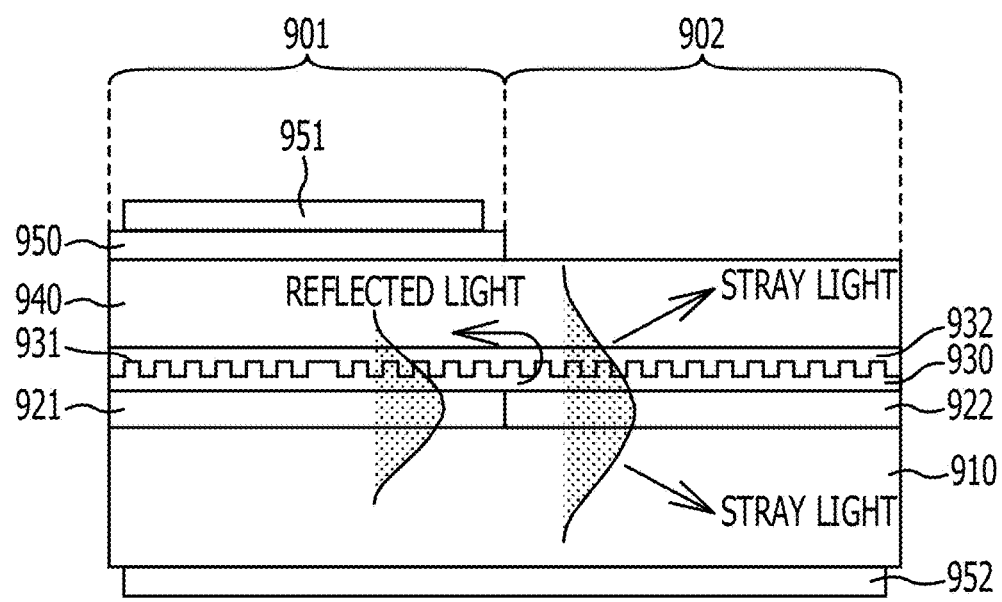
FIG. 21 is an explanatory diagram in the case where refractive indices are different in common optical waveguide.

In the optical device, the optical waveguide may be made from different materials. Specifically, an optical device illustrated as FIG. 21 will be described. The optical device illustrated as FIG. 21 is provided with an AlGaInAs based MQW active layer 921 in one region 901 on a semiconductor substrate 910 and a GaInAsP based guide layer 922 in the other region 902. The AlGaInAs based MQW active layer 921 and the GaInAsP based guide layer 922 are joined at the center portion. A diffraction grating layer 930 provided with a diffraction grating 931 is disposed on the AlGaInAs based MQW active layer 921 and the GaInAsP based guide layer 922, and a semiconductor burying layer 932 is disposed on the diffraction grating 931 of the diffraction grating layer 930. A clad layer 940 is disposed on the semiconductor burying layer 932, and a contact layer 950 and an upper electrode 951 are disposed in the one region 901 on the clad layer 940. A lower electrode 952 is disposed on the back of the semiconductor substrate 910.

In the optical device having such a structure, an optical waveguide is formed from the AlGaInAs based MQW active layer 921 and the GaInAsP based guide layer 922 in the region provided with the clad layer 940. The AlGaInAs based MQW active layer 921 is made from a material having a lasing wavelength of 1.31 µm and an equivalent refractive index of 3.266 and the GaInAsP based guide layer 922 is made from a material having a lasing wavelength of 1.15 µm and an equivalent refractive index of 3.239. In this case, the light goes from the one region 901 toward the other region 902 is scattered at the interface between the one region 901 and the other region 902, partly becomes stray light, and partly returns as reflected light, so that a propagation loss increases.

[Optical device]

Figure 22:
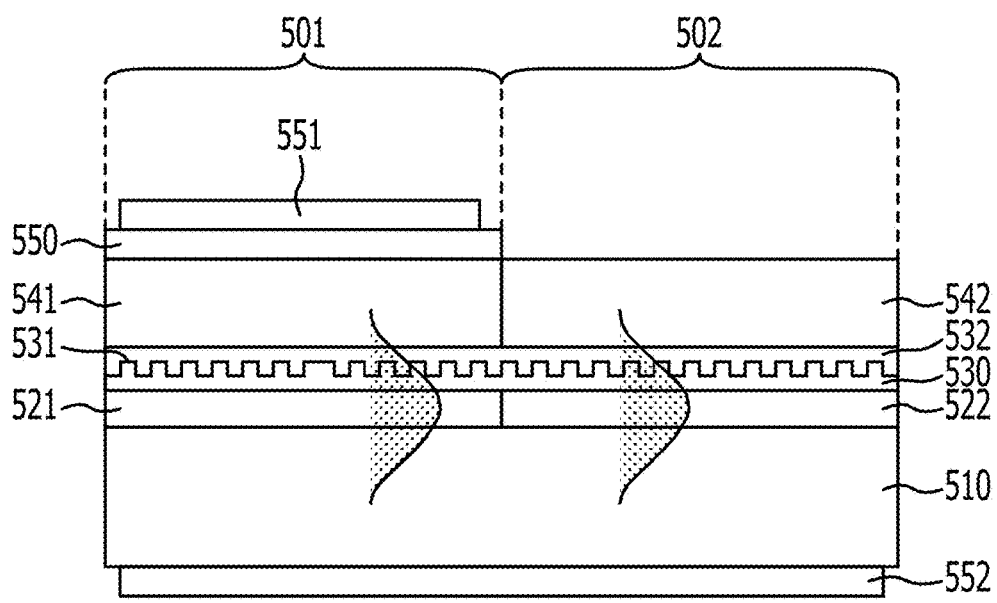
FIG. 22 is an explanatory diagram of an optical device according to a sixth embodiment.

Next, an optical device according to a sixth embodiment will be described. An optical device in the present embodiment is a ridge waveguide optical device, as illustrated in FIG. 22. The optical device according to the present embodiment is provided with an AlGaInAs based MQW active layer 521 in one region 501 on a semiconductor substrate 510 and a GaInAsP based guide layer 522 in the other region 502. The AlGaInAs based MQW active layer 521 and the GaInAsP based guide layer 522 are joined at the center portion. A diffraction grating layer 530 provided with a diffraction grating 531 is disposed on the AlGaInAs based MQW active layer 521 and the GaInAsP based guide layer 522, and a semiconductor burying layer 532 is disposed on the diffraction grating 531 of the diffraction grating layer 530. A clad layer, although not illustrated in the drawing, is disposed in the region to be provided with an optical waveguide on the semiconductor burying layer 532. Beside both side surfaces of the clad layer, first burying material layers 541 are disposed in a first region 501 and second burying material layers 542 are disposed in a second region 502. A contact layer 550 and an upper electrode 551 are disposed in the first region 501 provided with the AlGaInAs based MQW active layer 521. A lower electrode 552 is disposed on the back of the semiconductor substrate 510. In the present embodiment, the optical waveguide is formed from the AlGaInAs based MQW active layer 521 and the GaInAsP based guide layer 522 in the region provided with the clad layer, although not illustrated in the drawing.

The AlGaInAs based MQW active layer 521 is made from a material having a lasing wavelength of 1.31 µm and an equivalent refractive index of 3.266 and the GaInAsP based guide layer 522 is made from a material having a lasing wavelength of 1.15 µm and an equivalent refractive index of 3.239. In the present embodiment, the refractive index n2 of the material constituting the second burying material layer 542 is specified to become larger than the refractive index n1 of the material constituting the first burying material layer 541, that is, n2>n1 is satisfied. Consequently, the equivalent refractive index of the AlGaInAs based MQW active layer 521 is nearly equalized to the equivalent refractive index of the GaInAsP based guide layer 522, so that scattering and reflection at the interface between the AlGaInAs based MQW active layer 521 and the GaInAsP based guide layer 522 may be suppressed. In this manner, the propagation loss may be suppressed.

Seventh Embodiment

Figure 23:
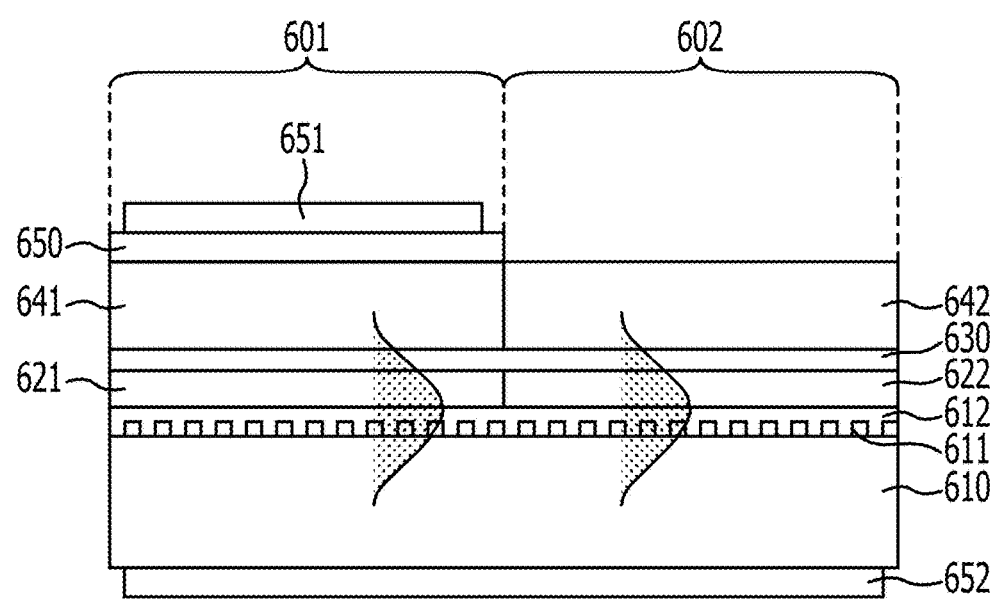
FIG. 23 is an explanatory diagram of an optical device according to a seventh embodiment.

Next, a seventh embodiment will be described. An optical device in the present embodiment is a ridge waveguide optical device. As illustrated in FIG. 23, a diffraction grating 611 is disposed on the surface of the semiconductor substrate 610 and a semiconductor burying layer 612 is disposed on the diffraction grating 611. An AlGaInAs based MQW active layer 621 is disposed in one region 601 on the semiconductor burying layer 612 and a GaInAsP based guide layer 622 is disposed in the other region 602. The AlGaInAs based MQW active layer 621 and the GaInAsP based guide layer 622 are joined at the center portion. A first clad layer 630 is disposed on the AlGaInAs based MQW active layer 621 and the GaInAsP based guide layer 622. A clad layer, although not illustrated in the drawing, is disposed in the region to be provided with an optical waveguide on the first clad layer 630. Beside both side surfaces of the clad layer, first burying material layers 641 are disposed in the first region 601 and second burying material layers 642 are disposed in the second region 602. A contact layer 650 and an upper electrode 651 are disposed in the first region 601 provided with the AlGaInAs based MQW active layer 621. A lower electrode 652 is disposed on the back of the semiconductor substrate 610. In the present embodiment, the optical waveguide is formed from the AlGaInAs based MQW active layer 621 and the GaInAsP based guide layer 622 in the region provided with the clad layer, although not illustrated in the drawing.

The AlGaInAs based MQW active layer 621 is made from a material having a lasing wavelength of 1.31 μm and an equivalent refractive index of 3.266 and the GaInAsP based guide layer 622 is made from a material having a lasing wavelength of 1.15 μm and an equivalent refractive index of 3.239. In the present embodiment, the refractive index n2 of the material constituting the second burying material layer 642 is specified to become smaller than the refractive index n1 of the material constituting the first burying material layer 641, that is, n2<n1 is satisfied. Consequently, the equivalent refractive index of the AlGaInAs based MQW active layer 621 is nearly equalized to the equivalent refractive index of the GaInAsP based guide layer 622, so that scattering and reflection at the interface between the AlGaInAs based MQW active layer 621 and the GaInAsP based guide layer 622 may be suppressed. In this manner, the propagation loss may be suppressed.

[Method for Manufacturing Optical Device]

Next, a method for manufacturing an optical device according to the present embodiment will be described with reference to FIG. 24A to FIG. 30B.

Figure 24A:
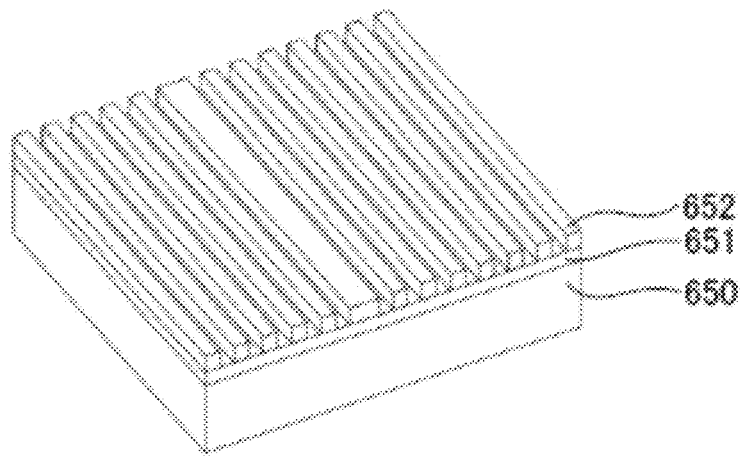
FIGS. 24A to 24C are process diagrams of a method for manufacturing the optical device according to the seventh embodiment.

Initially, as illustrated in FIG. 24A, an n-type doped GaInAsP layer 651 having a composition wavelength of 1.15 μm and a thickness of 100 nm is formed on an n-type doped InP substrate 650 by a metal-organic vapor phase epitaxy (MOVPE) method. Thereafter, an electron beam resist (ZEP520 produced by ZEON Corporation) is applied to the surface of the resulting n-type doped GaInAsP layer 651, and a diffraction grating mask 652 to form a diffraction grating is formed by an electron beam exposure method.

Figure 24B:
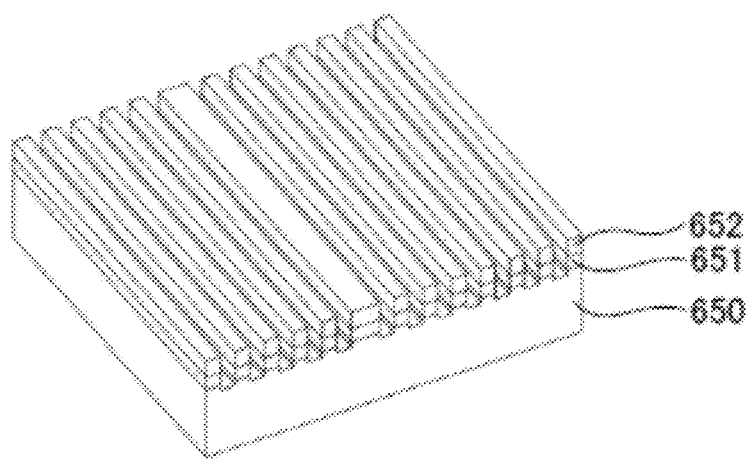

Subsequently, as illustrated in FIG. 24B, reactive ion etching (RIE) is performed using an ethane/hydrogen mixed gas, where the resulting diffraction grating mask 652 serves as a mask. Consequently, the n-type doped GaInAsP layer 651 having a composition wavelength of 1.15 μm and a thickness of 100 nm is penetrated and the surface of the n-type doped InP substrate 650 is over etched by about 15 nm.

Figure 24C:
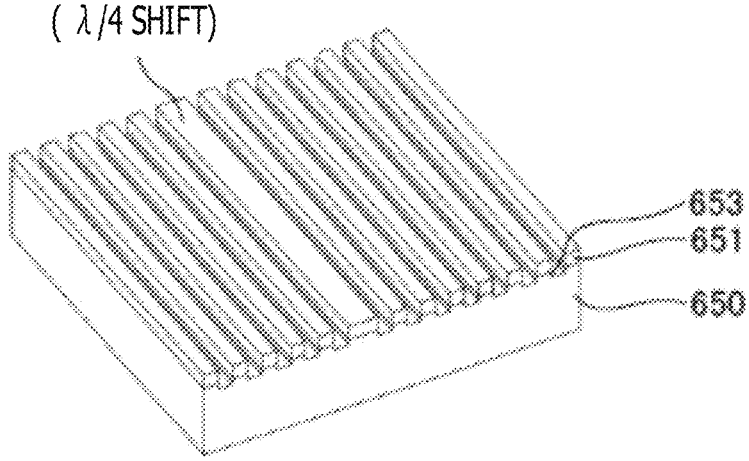

As illustrated in FIG. 24C, the diffraction grating mask 652 is peeled off. In this manner, the diffraction grating 653 is formed. In the thus formed diffraction grating 653, the phase is configured to have a phase shift of π radian at the resonator center of the device.

Figure 25A:
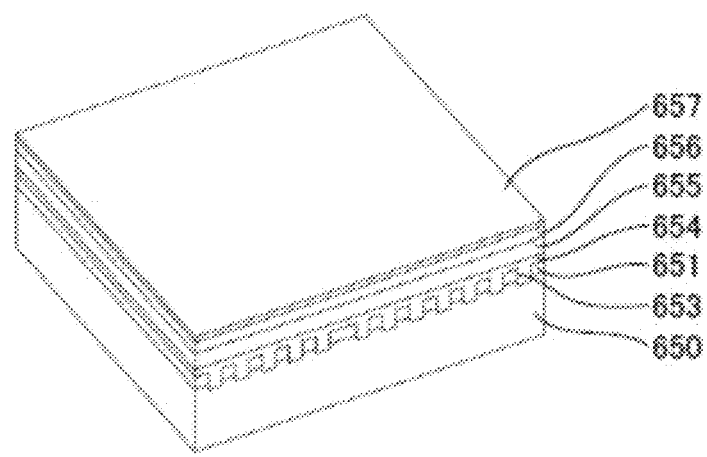
FIGS. 25A to 25C are process diagrams of the method for manufacturing the optical device according to the seventh embodiment.

As illustrated in FIG. 25A, an n-type doped InP layer 654 having a thickness of 80 nm is formed on the n-type doped InP substrate 650 and the n-type doped GaInAsP layer 651 of the surface provided with the diffraction grating 653 by MOVPE. Thereafter, a quantum well active layer 655 and a p-type doped InP clad layer 656 having a thickness of 150 nm are formed. Furthermore, a SiO2 layer 657 having a thickness of 400 nm to form an etching mask described later is formed on the p-type doped InP clad layer 656 by a chemical vapor deposition (CVD) method. The quantum well active layer 655 is formed by stacking undoped AlGaInAs quantum well layers having a thickness of 6 nm and an amount of compressive strain of 1.0% and undoped AlGaInAs barrier layers having a composition wavelength of 1.05 μm and a thickness of 10 nm alternately. In the present embodiment, the number of layers of quantum well layers in the quantum well active layer 655 is twelve layers, and the emission wavelength is 1,310 nm. These quantum well/barrier layers are sandwiched between undoped AlGaInAs SCH layers having a wavelength of 1.05 μm and a thickness of 10 nm, although not illustrated in the drawing.

Figure 25B:
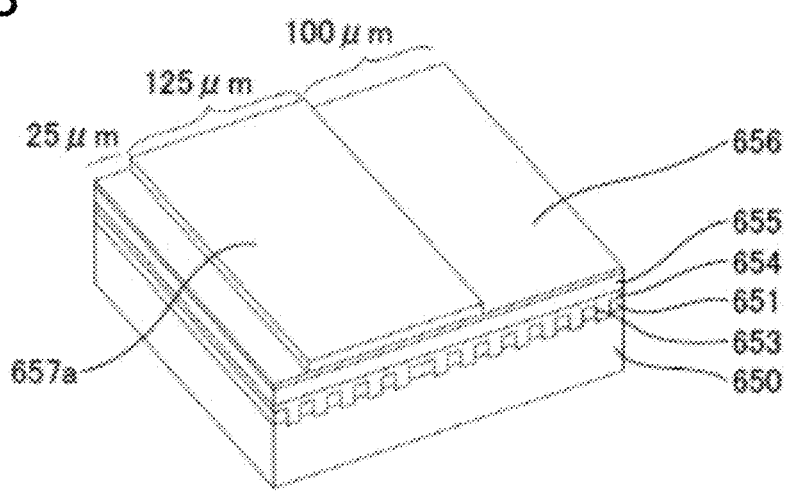

As illustrated in FIG. 25B, a resist pattern, although not illustrated in the drawing, is formed on a portion serving as a first region by applying photoresist to the SiO2 layer 657 and inducing exposure and development by an exposure apparatus. Thereafter, the SiO2 layer 657 in the region not provided with the resist pattern is removed by wet etching, so as to form an etching mask layer 657a from SiO2. The resist pattern is removed. The thus formed etching mask layer 657a is disposed on the portion to be provided with the first region and is formed having a length of 125 μm in a position between at a distance of 25 μm from one end and at a distance of 100 μm from the other end.

Figure 25C:
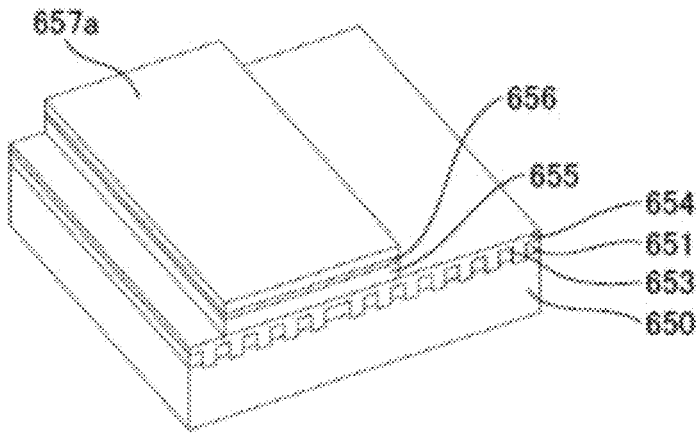

As illustrated in FIG. 25C, the quantum well active layer 655 and the p-type doped InP clad layer 656 in the region not provided with the etching mask layer 657a are removed by dry etching or the like. Consequently, the n-type doped InP layer 654 is exposed at a portion to be provided with the second region.

Figure 26A:
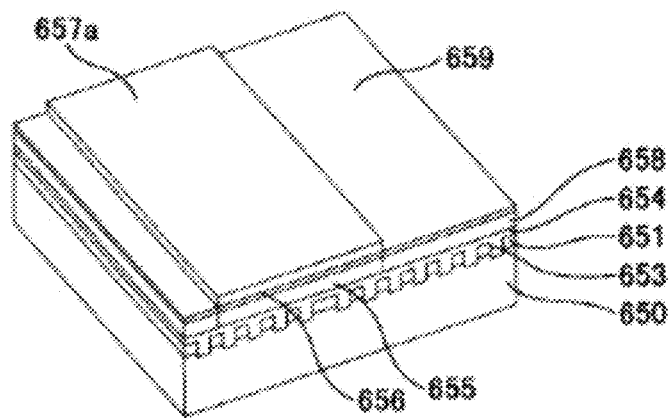
FIGS. 26A to 26C are process diagrams of the method for manufacturing the optical device according to the seventh embodiment.

As illustrated in FIG. 26A, an undoped GaInAsP light guide layer 658 having a composition wavelength of 1.18 μm and a thickness of 210 nm and an undoped InP layer 659 having a thickness of 210 nm are formed by a selective growth MOVPE method. The undoped GaInAsP light guide layer 658 and the undoped InP layer 659 are formed by the selective growth MOVPE method and, therefore, are formed only in a region which serves as the second region and at which the n-type doped InP layer 654 is exposed. Consequently, these films are not formed in a region which serves as the first region and in which the etching mask layer 657a is disposed.

Figure 26B:
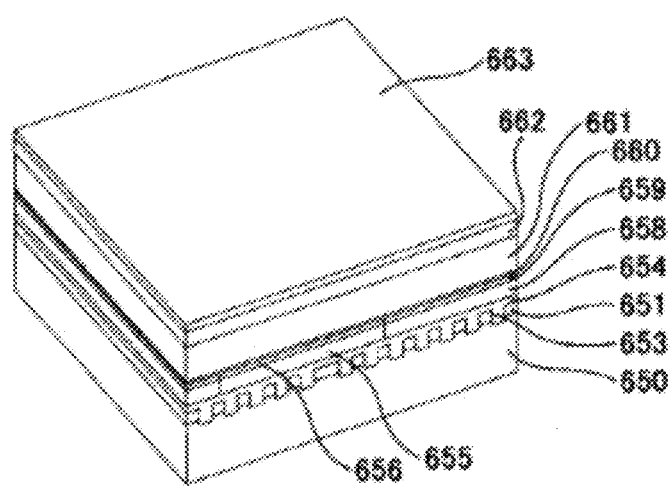

As illustrated in FIG. 26B, the etching mask layer 657a is removed with buffered hydrofluoric acid. Thereafter, a p-type doped GaInAsP etch stop layer 660 having a composition wavelength of 1.1 μm and a thickness of 20 nm is formed on the p-type doped InP clad layer 656 and the undoped InP layer 659 by MOVPE. Furthermore, a p-type doped InP clad layer 661 having a thickness of 1.5 μm and a p-type doped GaInAs contact layer 662 having a thickness of 300 nm are formed sequentially on the p-type doped GaInAsP etch stop layer 660 by MOVPE. Then, a SiO2 layer 663 having a thickness of 400 nm to form an etching mask described later is formed on the p-type doped GaInAs contact layer 662 by a chemical vapor deposition (CVD) method.

Figure 26C:
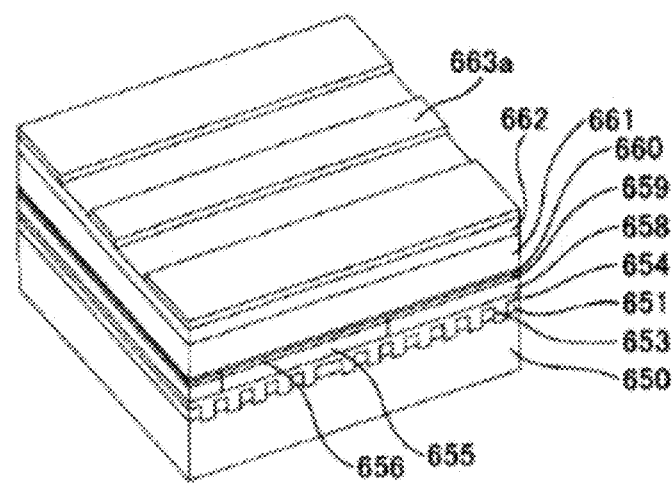

As illustrated in FIG. 26C, a stripe-shaped resist pattern, although not illustrated in the drawing, is formed by applying photoresist to the SiO2 layer 663 and inducing exposure and development by an exposure apparatus. Thereafter, the SiO2 layer 663 in the region not provided with the resist pattern is removed by wet etching, so as to form an etching mask layer 663a from SiO2. The resist pattern is removed. The thus formed etching mask layer 663a has the shape of a stripe having a width of 1.5 μm, and opening portions having a width of 6 μm are further provided.

Figure 27A:
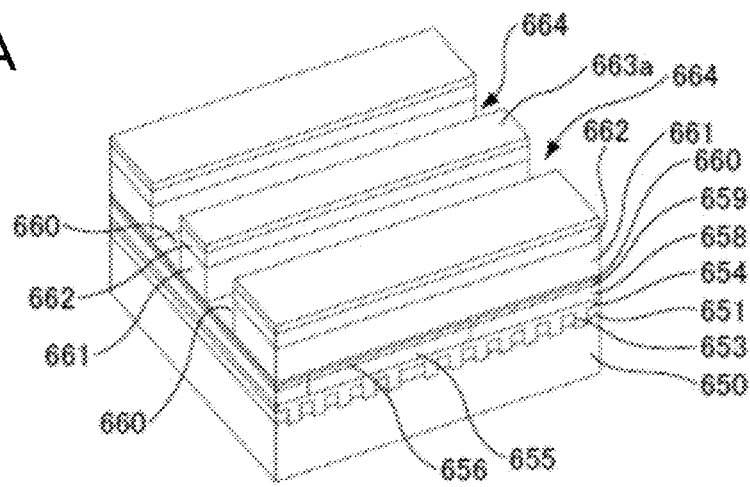
FIGS. 27A to 27C are process diagrams of the method for manufacturing the optical device according to the seventh embodiment.

As illustrated in FIG. 27A, the p-type doped InP clad layer 661 and the p-type doped GaInAs contact layer 662 in the region not provided with the etching mask layer 663a are removed by using dry etching and wet etching in combination. This etching is stopped at the p-type doped GaInAsP etch stop layer 660. In this manner, the p-type doped InP clad layer 661 and the p-type doped GaInAs contact layer 662 are formed into the shape of a ridge stripe having a width of 1.5 μm. Trenches 664 having a width of 6 μm are formed on both sides of the p-type doped InP clad layer 661 and the p-type doped GaInAs contact layer 662 formed into the shape of a stripe.

Figure 27B:
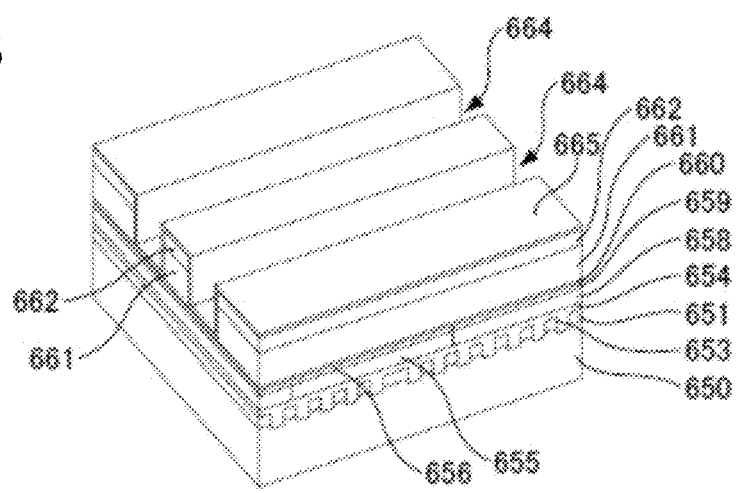

As illustrated in FIG. 27B, the etching mask layer 663a is removed with buffered hydrofluoric acid and, thereafter, a SiN passivation film 665 having a thickness of 20 nm is formed by plasma CVD or the like.

Figure 27C:
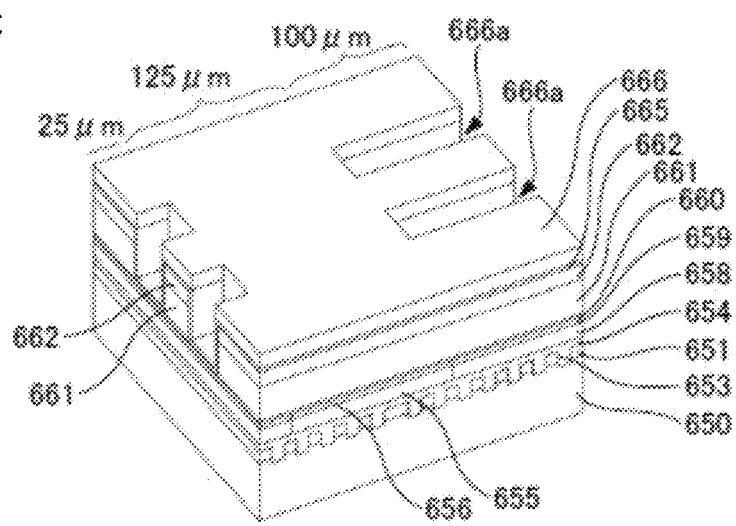

As illustrated in FIG. 27C, a resist pattern 666 having opening portions 666a in the regions to be provided with second burying material layers 667 described later in the trenches 664 is formed. Specifically, the resist pattern 666 having opening portions 666a in the regions to be provided with the second burying material layers 667 is formed by applying photoresist to the SiN passivation film 665 and inducing exposure and development by an exposure apparatus. The thus formed resist pattern 666 is provided with the openings 666a in a region having a length of 25 μm from one end and a region having a length of 100 μm from the other end of the trench 664. The center portion having a length of 125 μm is filled with the resist pattern 666.

Figure 28A:
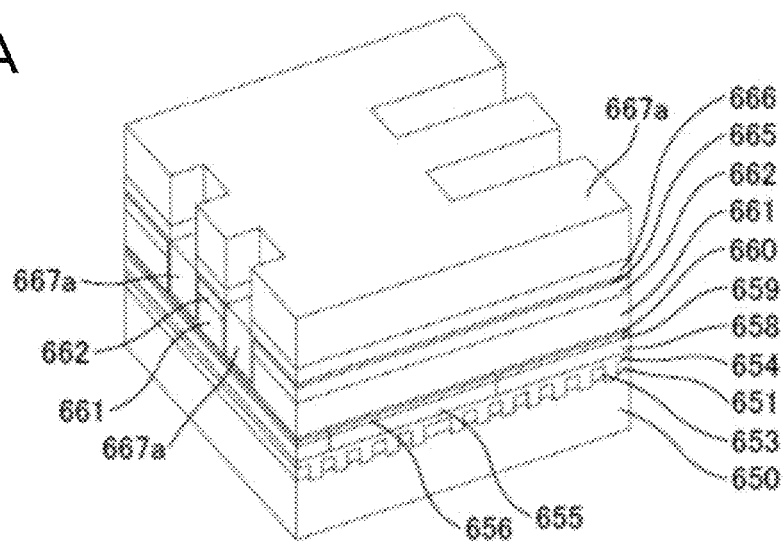
FIGS. 28A to 28C are process diagrams of the method for manufacturing the optical device according to the seventh embodiment.

As illustrated in FIG. 28A, a TiO2 film 667a is formed on the surface provided with the resist pattern 666 until the trenches are filled by vacuum evaporation or the like.

Figure 28B:
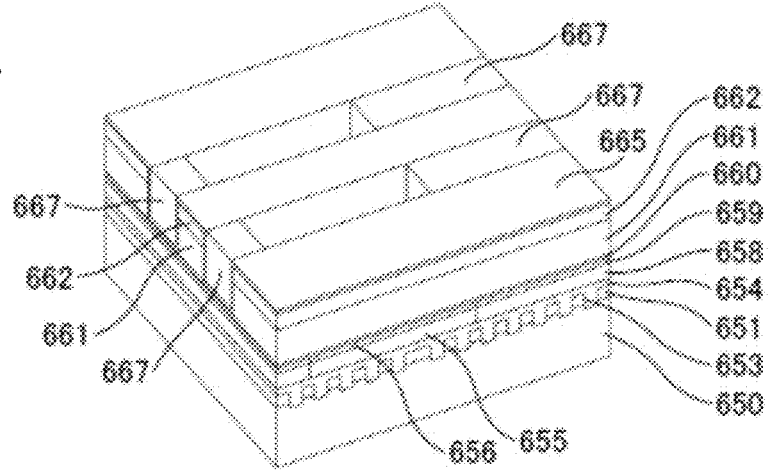

As illustrated in FIG. 28B, the TiO2 film 667a formed on the resist pattern 666 is removed together with the resist pattern 666 by lift-off through dipping into an organic solvent or the like. In this manner, the second burying material layers 667 are formed from the TiO2 film 667a remaining in the trenches.

Figure 28C:
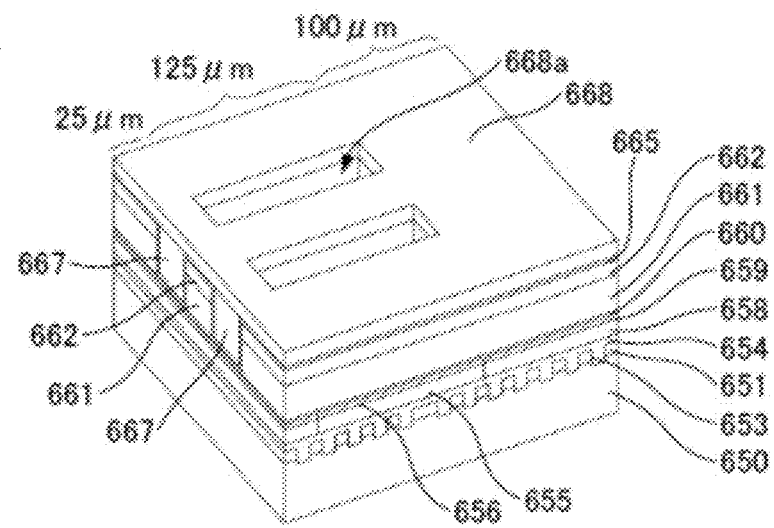

As illustrated in FIG. 28C, a resist pattern 668 having opening portions 668a in the regions to be provided with first burying material layers 669 described later, that is, the regions not provided with the second burying material layers 667 in the trenches, is formed. Specifically, the resist pattern 668 having opening portions 668a in the regions to be provided with the first burying material layers 669 is formed by applying photoresist to the second burying material layers 667, the SiN passivation film 665, and the like and inducing exposure and development by an exposure apparatus. The thus formed resist pattern 668 is provided with the opening portions 668a having a length of 125 μm in the center portions.

Figure 29A:
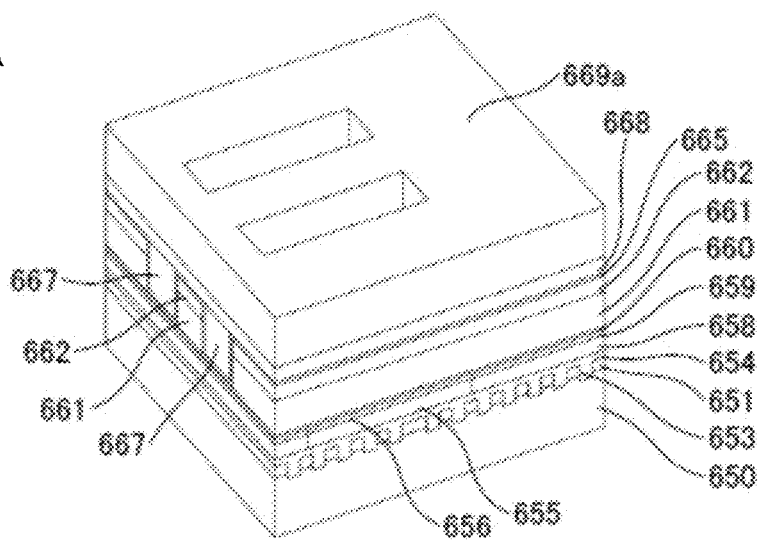
FIGS. 29A to 29C are process diagrams of the method for manufacturing the optical device according to the seventh embodiment.

As illustrated in FIG. 29A, a MgF2 film 669a is formed on the surface provided with the resist pattern 668 until the trenches are filled by vacuum evaporation or the like.

Figure 29B:
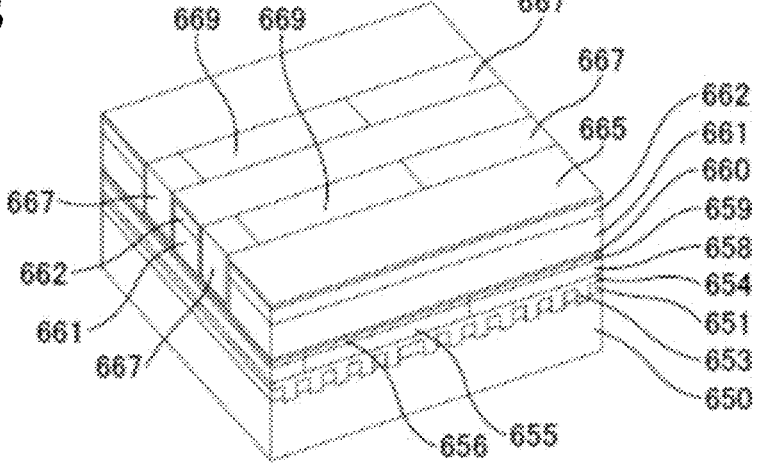

As illustrated in FIG. 29B, the MgF2 film 669a formed on the resist pattern 668 is removed together with the resist pattern 668 by lift-off through dipping into an organic solvent or the like. Consequently, the first burying material layers 669 are formed from the MgF2 film 669a remaining in the trenches. In this manner, beside both side surfaces of the p-type doped InP clad layer 661, the first burying material layers 669 made from MgF2 having a length of 125 μm are formed in the center portions and the second burying material layers 667 made from TiO2 are formed having a length of 25 μm in one end portion in contact with the center portion and having a length of 100 μm in the other end portion in contact with the center portion.

Figure 29C:
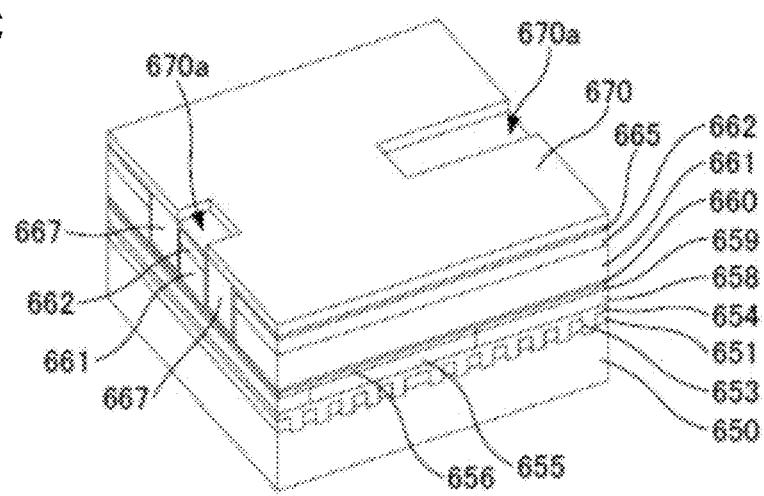

As illustrated in FIG. 29C, a resist pattern 670 having opening portions 670a in regions serving as the second region is formed just above the region provided with the p-type doped InP clad layer 661. Specifically, photoresist is applied to the first burying material layers 669, the second burying material layers 667, the SiN passivation film 665, and the like, and exposure and development are induced by an exposure apparatus. In this manner, the resist pattern 670 having opening portions 670a just above the region provided with the p-type doped InP clad layer 661 and in the region provided with the undoped GaInAsP light guide layer 658 is disposed.

Figure 30A:
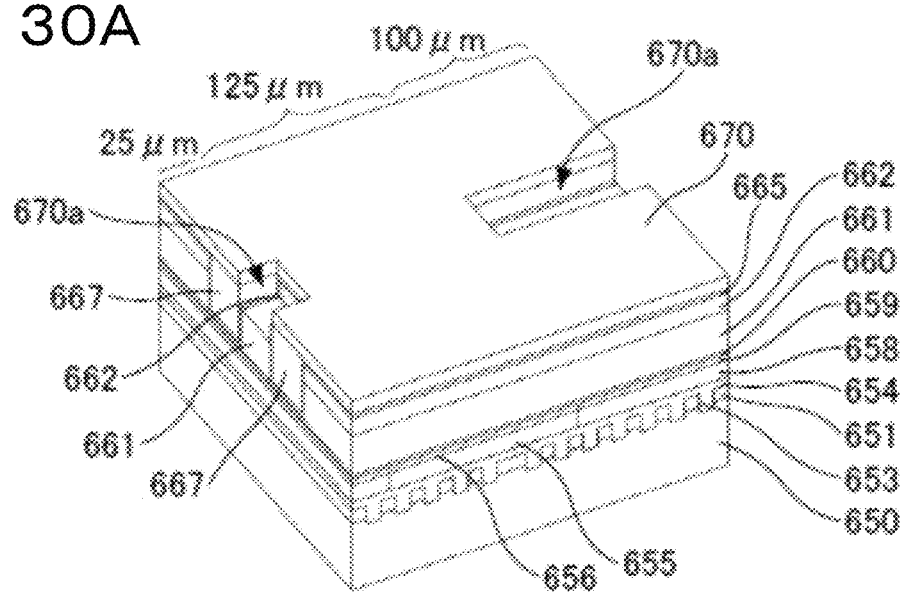
FIGS. 30A and 30B are process diagrams of the method for manufacturing the optical device according to the seventh embodiment.

As illustrated in FIG. 30A, the SiN passivation film 665 and the p-type doped GaInAs contact layer 662 in the opening portions 670a are removed. Consequently, the layer and the like just above the region provided with the p-type doped InP clad layer 661 are removed and, thereby, the p-type doped InP clad layer 661 in the region provided with the undoped GaInAsP light guide layer 658 is exposed.

Figure 30B:
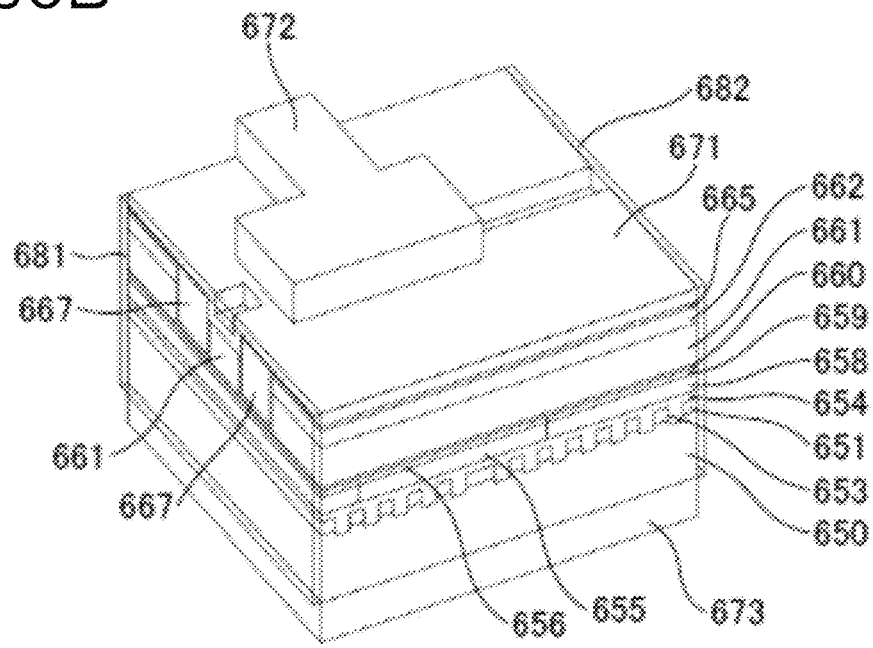

As illustrated in FIG. 30B, the resist pattern 670 is removed and a SiN passivation film 671 having a thickness of 600 nm is formed on the first burying material layers 667, the second burying material layers 669, the SiN passivation film 665, and the like by plasma CVD or the like. Furthermore, the SiN passivation film 665 and the SiN passivation film 671 are removed, as occasion calls, to expose the p-type doped GaInAs contact layer 662, and a p-electrode 672 is formed. An n-electrode 673 is formed on the back of the n-type doped InP substrate 650. In addition, nonreflective coating films (antireflective films) 681 and 682 are formed from a single-layer or multilayer dielectric film on both end surfaces of the laser, so that an optical device according to the present embodiment is produced.

In FIG. 24A to FIG. 30B, the n-type doped InP substrate 650 corresponds to the semiconductor substrate 610 in FIG. 23, the n-type doped InP layer 654 corresponds to the semiconductor burying layer 612, and the quantum well active layer 655 corresponds to the AlGaInAs based MQW active layer 621. The undoped GaInAsP light guide layer 658 corresponds to the GaInAsP based guide layer 622, the p-type doped InP clad layer 656 and the undoped InP layer 659 correspond to the first clad layer 630, and the p-electrode 672 corresponds to the upper electrode 651. The n-electrode 673 corresponds to the lower electrode 652, the first burying material layer 669 corresponds to the first burying material layer 641, and the second burying material layer 667 corresponds to the second burying material layer 642.

In the case where the trench is filled with the same material, as illustrated in FIG. 21, the refractive index of the AlGaInAs active layer is higher than the refractive index of the GaInAsP light guide layer and, as a result, scattering and reflection occur at the joint portion of different types of waveguide because the equivalent refractive indices are different. However, in the optical device according to the present embodiment, a difference in refractive index between the materials is reduced by decreasing the refractive index of the material filled into the AlGaInAs active layer side of the trench. Therefore, scattering and reflection at the joint portion of different types of waveguide may be suppressed.

The contents other than those described above are the same as the first embodiment.

In the first to fourth embodiments, the optical devices in the case where the quantum well produced on the InP substrate is formed from a GaInAsP based material has been described. However, the material constituting the quantum well may be an AlGaInAs based compound semiconductor. In the sixth or seventh embodiments, the optical device in the case where the quantum well produced on the InP substrate is formed from an AlGaInAs based material has been described. However, the material constituting the quantum well may be a GaInAsP based compound semiconductor.

Meanwhile, in the case where the active layer is not formed from the quantum well but formed from a bulk type semiconductor, the same effects are obtained. The semiconductor substrate may be formed with a structure exhibiting electrical conductivity reverse to that of the structure described above by using a semiconductor substrate having the p-type electrical conductivity in place of the semiconductor having the n-type electrical conductivity.

Production may be performed on a semi-insulating substrate in place of the semiconductor substrate. The same effect is also obtained in the case where a substrate formed by bonding a silicon substrate and the like together is used. In the present embodiments, the DFB lasers have been described in the first to fourth embodiments and the distributed-reflector (DR) laser has been described in the sixth or seventh embodiment. However, the present embodiments are not limited to them, and lasers, for example, a distributed Bragg reflector (DBR) laser, may be employed. The same effects may be obtained by application to not only active type elements, for example, a laser element, but also passive type optical devices, for example, an optical filter.

The material constituting the optical device may be not only the compound semiconductor but also an organic material or an inorganic material, and may be applied to optical devices, in which a diffraction grating is incorporated in the vicinity of the optical waveguide, in general.

In the optical device according to the present embodiment, the coupling coefficient may have any distribution in the resonator. The numbers and positions of formation of the first burying material layers and the second burying material layers formed in the trench may be optionally set in accordance with the desirable characteristics of the optical device.

In the present embodiments, the case where the phase has a phase shift of π at the resonator center has been described. However, a structure having no phase shift or a structure having a plurality of phase shifts may be employed, and each amount of one or a plurality of phase shifts may be set optionally.

In the present embodiments, the structure in which non-reflective coating is applied to both end surfaces has been described, although any combination of nonreflection/cleavage/high reflection may be used as the combination of the end surface structures. The material which is filled beside the ridge may not be formed in such a way as to become almost flush with the ridge and flat. Meanwhile, the first burying material layer may be formed at the start and, subsequently, the second burying material layer may be formed in such a way as to cover the resulting first burying material layer.

A structure in which the diffraction grating is incorporated in the side opposite to the substrate with respect to the optical waveguide is preferable because a larger effect is obtained as compared with a structure in which the diffraction grating is incorporated in the substrate side with respect to the optical waveguide.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A ridge waveguide optical device comprising:
an active layer formed over a semiconductor substrate;
a diffraction grating formed over the active layer, the diffraction grating being formed by forming an unevenness on a surface of a diffraction grating layer;
a semiconductor burying layer formed on the surface of the diffraction grating layer;
a clad layer formed into the shape of a ridge stripe and formed partially over the diffraction grating;
a first burying material layer formed on the side of the clad layer and over the diffraction grating; and
a second burying material layer formed on the side of the clad layer and over the diffraction grating, the second burying material layer formed in a horizontal direction next to the first burying material layer,
wherein a refractive index of the first burying material layer is different from a refractive index of the second burying material layer,
wherein any one of the first burying material layer and the second burying material layer is made from a material containing TiO2 and the other is made from a material containing MgF2.

2. The optical device according to claim 1, wherein the refractive index of the first burying material layer is greater than the refractive index of the second burying material layer.

3. The optical device according to claim 1, wherein the refractive index of the first burying material layer is larger than the refractive index of the second burying material layers.

4. The optical device according to claim 1, further comprising:
an upper electrode formed over the clad layer; and
a lower electrode formed over a back of the semiconductor substrate.

5. The optical device according to claim 1, wherein
the semiconductor substrate is made from a material containing InP.

6. The optical device according to claim 1, wherein
the clad layer is made from a material containing InP.

7. The optical device according to claim 1, wherein
the active layer is made from a material containing GaInAsP or AlGaInAs.

8. An optical device comprising:
a semiconductor substrate including a first region and a second region that is next to the first region in a horizontal direction;
an active layer formed in the first region over the semiconductor substrate;
a guide layer formed in the second region over the semiconductor substrate;
a diffraction grating formed in both the first region and the second region and over the active layer and the guide layer, the diffraction grating being formed by forming an unevenness on a surface of a diffraction grating layer; and
a clad layer formed into the shape of a ridge stripe and formed partially over the diffraction grating,
a first burying material layer formed on the side of the clad layer and over the diffraction grating; and
a second burying material layer formed on the side of the clad layer and over the diffraction grating, the second burying material layer formed in a horizontal direction next to the first burying material layer,
wherein any one of the first burying material layer and the second burying material layer is made from a material containing TiO2 and the other is made from a material containing MgF2.

9. The optical device according to claim 8, wherein
an equivalent refractive index of the active layer is larger than an equivalent refractive index of the guide layer.

10. The optical device according to claim 8, wherein
an upper electrode is formed over the clad layer in the first region, and
a lower electrode is formed over the back of the semiconductor substrate.

11. The optical device according to claim 8, wherein
the guide layer is made from a material containing GaInAsP.

12. An optical module comprising:
a semiconductor laser configured to have a ridge waveguide optical device, the ridge waveguide optical device including
a diffraction grating formed over the active layer, the diffraction grating being formed by forming an unevenness on a surface of a diffraction grating layer;
a semiconductor burying layer formed on the surface of the diffraction grating layer;
a clad layer formed into the shape of a ridge stripe and formed partially over the diffraction grating,
a first burying material layer formed on a side of the clad layer and over the diffraction grating, and
a second burying material layer formed on the side of the clad layer and over the diffraction grating, the second burying material layer being formed in a horizontal direction next to the first burying material layer,
wherein a refractive index of the first burying material layer is different from a refractive index of the second burying material layer,
wherein any one of the first burying material layer and the second burying material layer is made from a material containing TiO2 and the other is made from a material containing MgF2.

* * * * *